US012583875B2

(12) United States Patent
Kobayashi et al.

(10) Patent No.: US 12,583,875 B2
(45) Date of Patent: Mar. 24, 2026

(54) PYRROMETHENE-BORON COMPLEX, COLOR CONVERSION COMPOSITION, COLOR CONVERSION FILM, LIGHT SOURCE UNIT, DISPLAY, AND ILLUMINATION DEVICE

(71) Applicant: Toray Industries, Inc., Tokyo (JP)

(72) Inventors: Kazuki Kobayashi, Otsu (JP); Daisaku Tanaka, Otsu (JP); Yasunori Ichihashi, Otsu (JP)

(73) Assignee: Toray Industries, Inc., Tokyo (JP)

( * ) Notice: Subject to any disclaimer, the term of this patent is extended or adjusted under 35 U.S.C. 154(b) by 1097 days.

(21) Appl. No.: 17/626,904

(22) PCT Filed: Jul. 10, 2020

(86) PCT No.: PCT/JP2020/027138
§ 371 (c)(1),
(2) Date: Jan. 13, 2022

(87) PCT Pub. No.: WO2021/015020
PCT Pub. Date: Jan. 28, 2021

(65) Prior Publication Data

US 2022/0251119 A1 Aug. 11, 2022

(30) Foreign Application Priority Data

Jul. 24, 2019 (JP) ................................ 2019-136072

(51) Int. Cl.

| | |
|---|---|
| ***C07F 7/08*** | (2006.01) |
| ***C07F 5/02*** | (2006.01) |
| ***C09K 11/06*** | (2006.01) |
| ***H05B 33/14*** | (2006.01) |
| ***H10K 85/30*** | (2023.01) |

(52) U.S. Cl.
CPC ............ *C07F 7/0814* (2013.01); *C07F 5/027* (2013.01); *C09K 11/06* (2013.01); *H05B 33/14* (2013.01); *H10K 85/322* (2023.02)

(58) Field of Classification Search
CPC .......... C07F 7/0814; C07F 5/027; C07F 5/02; C07F 5/022; H10K 50/00; H10K 85/322; H10K 50/11; H10K 85/657; C09K 11/06; C09K 2211/1007; C09K 2211/1011; C09K 2211/1055; H05B 33/14; H10H 20/8512; F21V 9/45; C02F 1/133514; G02B 5/20; G09F 9/30
See application file for complete search history.

(56) References Cited

U.S. PATENT DOCUMENTS

2017/0260212 A1 9/2017 Lee et al.
2018/0134952 A1 5/2018 Ichihashi et al.
(Continued)

FOREIGN PATENT DOCUMENTS

CN 107614659 A 1/2018
CN 109996802 A 7/2019
(Continued)

OTHER PUBLICATIONS

US 2024/0240077 A1, with appended priority reference (JP 2020-050593) (Year: 2020).*
(Continued)

*Primary Examiner* — Fereydoun G Sajjadi
*Assistant Examiner* — Anne Grace Kuckla
(74) *Attorney, Agent, or Firm* — Buchanan Ingersoll & Rooney PC

(57) ABSTRACT

A pyrromethene-boron complex in one aspect of the present invention is a compound with a molecular weight of 1000 or more, represented by the following general formula (1), in which at least two of $R^1$ to $R^6$ are groups represented by the following general formula (2),

[Chem 1]

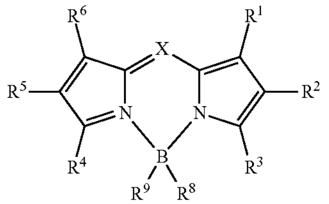

(1)

and in the general formula (1), X is C—$R^7$ or N; $R^1$ to $R^9$, other than the groups represented by the following general formula (2), each are the same or different, and selected from the candidate group consisting of alkyl and other groups;

[Chem 2]

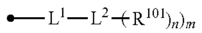

(2)

and in the general formula (2), $L^1$ is selected from the candidate group consisting of oxygen and other groups; $L^2$ is, for example, alkylene; when $L^2$ is alkylene, the carbon atom bound to $L^1$, in the alkylene group, is secondary or tertiary carbon; $R^{101}$ is, for example, cyano; n is an integer of 0 to 5; m is an integer of 1 to 5; and m-($L^2$-$(R^{101})_n$) each comprises three or more ring structures.

12 Claims, 1 Drawing Sheet

(56) References Cited

U.S. PATENT DOCUMENTS

| | | | | |
|---|---|---|---|---|
| 2019/0062348 | A1* | 2/2019 | Sung | C07F 5/022 |
| 2019/0170723 | A1 | 6/2019 | Wheeler | |
| 2019/0345380 | A1 | 11/2019 | Ichihashi et al. | |
| 2021/0061821 | A1 | 3/2021 | Kobayashi et al. | |
| 2021/0347790 | A1 | 11/2021 | Sung et al. | |

FOREIGN PATENT DOCUMENTS

| | | | | | |
|---|---|---|---|---|---|
| JP | 2000208262 | A | | 7/2000 | |
| JP | 2011241160 | A | | 12/2011 | |
| JP | 2014136771 | A | | 7/2014 | |
| JP | 2016-056126 | A | | 4/2016 | |
| JP | 2018-004928 | A | | 1/2018 | |
| JP | 2018505127 | A | | 2/2018 | |
| JP | 2018-053064 | A | | 4/2018 | |
| JP | 2019508377 | A | | 3/2019 | |
| JP | 2019509471 | A | | 4/2019 | |
| JP | 6693578 | B2 | | 5/2020 | |
| KR | 20190004552 | A | * | 1/2019 | C07F 5/022 |
| KR | 1020190004552 | A | | 1/2019 | |
| TW | 201825503 | A | | 7/2018 | |
| WO | WO-2017073923 | A1 | * | 5/2017 | G02B 5/20 |
| WO | 2019146332 | A1 | | 8/2019 | |
| WO | 2020080784 | A1 | | 4/2020 | |

OTHER PUBLICATIONS

Office Action (The First Office Action) issued Dec. 27, 2023, by the State Intellectual Property Office of People's Republic of China in corresponding Chinese Patent Application No. 202080036059.X and an English translation of the Office Action. (12 pages).

Rezende et al., "Thiocyanation of 3-Substituted and 3,5-Disubstituted BODIPYs and its Application for the Synthesis of New Fluorescent Sensors", Dyes and Pigments, 2018, vol. 154, pp. 155-163.

Extended European Search Report for EP Application No. 20844643.5, dated Sep. 26, 2022, 9 pages.

Taiwan Office Action for Taiwan Application No. 109124146, dated Aug. 3, 2022, with Search Report, 4 pages.

Japanese Notice of Reasons for Refusal for Japanese Application No. 2020-542031, dated Jan. 24, 2023 with translation, 9 pages.

Burghart et al., "3,5-Diaryl-4,4-difluoro-4-bora-3a,4a-diaza-s-indacene (BODIPY) Dyes: Synthesis, Spectroscopic, Electrochemical, and Structural Properties", J. Org. Chem., 1999, vol. 64, No. 21, pp. 7813-7819.

International Search Report and Written Opinion for International Application No. PCT/JP2020/027138, dated Sep. 24, 2020, 6 pages.

Kollmannsberger et al., "Electrogenerated Chemiluminescence and Proton-Dependent Switching of Fluorescence: Functionalized Difluoroboradiaza-s-indacenes", Angew. Chem. Int. Ed. Engl., 1997, vol. 36, No. 12, pp. 1333-1335.

* cited by examiner

[Fig. 1]
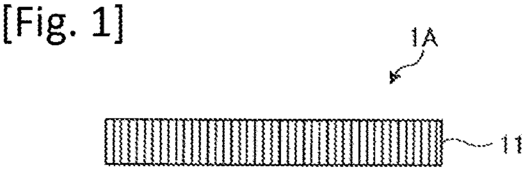
[Fig. 2]
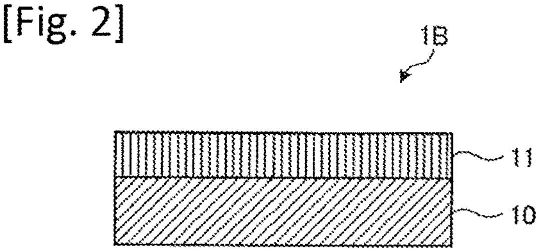
[Fig. 3]
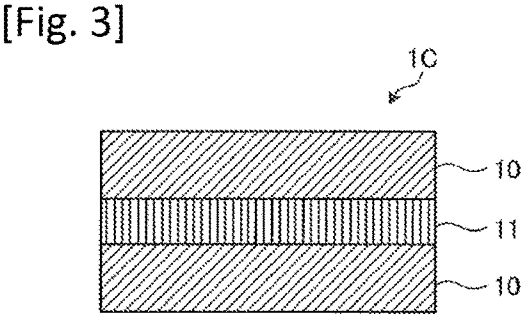
[Fig. 4]
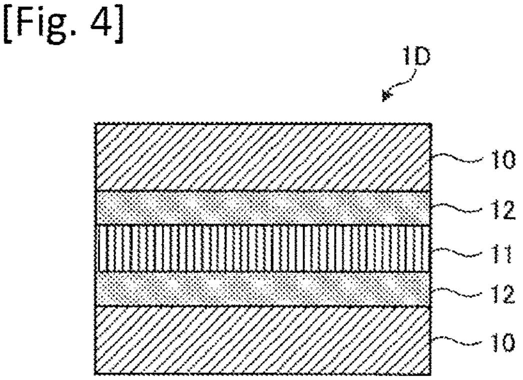

PYRROMETHENE-BORON COMPLEX, COLOR CONVERSION COMPOSITION, COLOR CONVERSION FILM, LIGHT SOURCE UNIT, DISPLAY, AND ILLUMINATION DEVICE

CROSS REFERENCE TO RELATED APPLICATIONS

This is the U.S. National Phase application of PCT/JP2020/027138, filed Jul. 10, 2020, which claims priority to Japanese Patent Application No. 2019-136072, filed Jul. 24, 2019.

FIELD OF THE INVENTION

The present invention relates to pyrromethene-boron complexes, color conversion compositions, color conversion films, light source units, displays, and illumination devices.

BACKGROUND OF THE INVENTION

The application of multi-color technologies using color conversion methods to liquid crystal displays, organic electroluminescent (EL) displays, illumination devices, and the like has been actively studied. Color conversion represents converting a light emission from an emitter into a light having a longer wavelength, for example, converting a blue light emission into a green light emission or a red light emission. A combination of a film formed from a composition having such color conversion function (hereinafter referred to as "color conversion composition") and, for example, a blue light source allows for obtaining the three primary colors, blue, green, and red, from the blue light source, or obtaining a white light. Using such a white light source combining a blue light source and a film having a color conversion function (hereinafter referred to as "color conversion film") as a light source unit, the light source unit, a liquid crystal actuator, and a color filter can be combined to produce a full-color display. When the liquid crystal actuator is absent, it can be directly used as a white light source, for example, can be applied as a white light source such as an LED illumination.

One of the challenges for liquid crystal displays is to improve the color reproduction. To improve the color reproduction, it is effective to narrow the full width at half maximum of the blue, green, and red emission spectra from a light source unit and increase the color purities of blue, green, and red colors. As a means to solve the challenge, a technology has been proposed employing quantum dots by using inorganic semiconductor microparticles as a component of a color conversion composition (see, for example, Patent Document 1). This technology using quantum dots surely provides narrow full widths at half maximum in green and red emission spectra and improves the color reproduction, but on the other hand, quantum dots are weak against heat, and water and oxygen in the air, and the durability has been insufficient.

Instead of quantum dots, technologies are proposed using organic light emitting materials as a component of a color conversion composition. As examples of the technologies using an organic light emitting material as a component of a color conversion composition, those using pyrromethene derivatives are disclosed (see, for example, Patent Documents 1 and 2).

PATENT LITERATURE

Patent Document 1: Japanese Laid-Open Patent Publication No. 2011-241160

Patent Document 2: Japanese Laid-Open Patent Publication No. 2014-136771

SUMMARY OF THE INVENTION

However, even color conversion compositions prepared with such organic light emitting materials have been still insufficient from the viewpoint of improvement of color reproduction and durability. In particular, there have been insufficient technologies for enabling both green light emission with high color purity and high durability.

A technical problem to be solved by the invention is to provide a suitable organic light emitting material as a color conversion material used in displays such as liquid crystal displays and illumination devices such as LED lightings, thereby achieving both improved color reproduction and high durability.

Accordingly, in order to solve the above-described problem and achieve the purpose, a pyrromethene-boron complex according to one aspect of the present invention is a compound with a molecular weight of 1000 or more, represented by the following general formula (1), wherein at least two of $R^1$ to $R^6$ in the general formula (1) are groups represented by the following general formula (2):

[Chem 1]

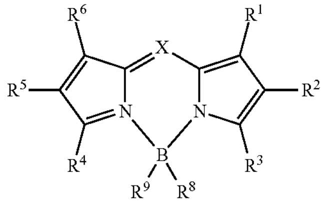

(1)

wherein in the general formula (1),

X is C—$R^7$ or N;

$R^1$ to $R^9$, other than the groups represented by the following general formula (2) of $R^1$ to $R^6$, each are the same or different, and selected from the group consisting of hydrogen, alkyl, cycloalkyl, heterocyclyl, alkenyl, cycloalkenyl, alkynyl, hydroxy, thiol, alkoxy, alkylthio, aryl ether, aryl thioether, aryl, heteroaryl, halogen, cyano, aldehyde, carbonyl, carboxyl, acyl, ester, amide, carbamoyl, amino, nitro, silyl, siloxanyl, boryl, sulfoxide, sulfonyl, phosphine oxide, and a fused ring formed by adjacent substituents;

[Chem 2]

$$\bullet\!-L^1-L^2\!\left(\!\left(R^{101}\right)_n\right)_m \quad (2)$$

wherein, in the general formula (2), $L^1$, each independently, is selected from the group consisting of oxygen, nitrogen, sulfur, alkenylene, cycloalkenylene, arylene, heteroarylene, carbonyl, —C(=O)O—, —C(=O)N<, imino group, —$S(=O)_2$—, and —P(=O)<;

$L^2$, each independently, is selected from the group consisting of alkylene, cycloalkylene, arylene, heterocyclyl, and heteroarylene;

when $L^2$ is alkylene, the carbon atom bound to $L^1$, in the alkylene group, is secondary or tertiary carbon;

$R^{101}$, each independently, is selected from the group consisting of cyano, aryl, and cycloalkyl;

n is each independently an integer of 0 to 5, and m is each independently an integer of 1 to 5; and m-($L^2$-($R^{101}$)$_n$) each comprises three or more ring structures.

In embodiments of the present invention, the pyrromethene-boron complex according to the above-described aspect is characterized in that, in the general formula (2), $L^1$, each independently, is selected from the group consisting of carbonyl, —C(=O)O—, —C(=O)N<, —S(=O)$_2$—, and —P(=O)<.

In embodiments of the present invention, the pyrromethene-boron complex according to the above-described aspect is characterized in that, in the general formula (1), at least one of $R^1$, $R^3$, $R^4$, and $R^6$ is alkyl or cycloalkyl.

The pyrromethene-boron complex according to one aspect of the present invention is characterized in that, in at least one group represented by the general formula (2), n is from 1 to 5, and at least one $R^{101}$ has a group comprising a fluorine atom.

The pyrromethene-boron complex according one aspect of the present invention is characterized in that, in the general formula (1), X is C—$R^7$, and $R^7$ is aryl or heteroaryl.

The pyrromethene-boron complex according to one aspect of the present invention is characterized in that the compound represented by the general formula (1) is a compound represented by the following general formula (3):

[Chem 3]

(3)

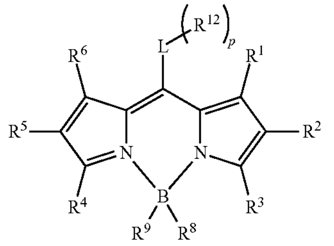

wherein in the general formula (3), $R^1$ to $R^6$, $R^8$, and $R^9$ are the same as in the general formula (1) or (2);

$R^{12}$, each independently, is aryl or heteroaryl;

L is arylene or heteroarylene; and p is an integer of 1 to 5.

The pyrromethene-boron complex according to one aspect of the present invention is characterized in that, in the general formula (1), at least one of $R^8$ and $R^9$ is cyano.

The pyrromethene-boron complex according to one aspect of the present invention is characterized in that the compound represented by the general formula (1) exhibits emission with a peak wavelength observed in a region of 500 nm or more and less than 580 nm by use of an excitation light.

A color conversion composition according to an aspect of the present invention is a color conversion composition for converting an incident light into a light having a longer wavelength than the incident light, comprising:

the pyrromethene-boron complex according to any one of the aspects described above; and a binder resin.

A color conversion film according to the present invention comprises a layer composed of the color conversion composition according to an aspect described above or a cured product thereof.

A light source unit according to the present invention comprises a light source, and the color conversion film according to the embodiments described above.

A display according to the present invention comprises the color conversion film according to the embodiments described above.

An illumination device according to the present invention comprises the color conversion film according to an aspect described above.

According to the present invention, a suitable pyrromethene-boron complex and color conversion composition as color conversion materials that can achieve both improved color reproduction and high durability can be provided. The color conversion film using the pyrromethene-boron complex or the color conversion composition according to the present invention has both light emission with high color purity and high durability, allowing for both improved color reproduction and high durability. The light source unit, the display, and the illumination device according to the present invention employ such a color conversion film, allowing for achieving both improved color reproduction and high durability.

BRIEF DESCRIPTION OF DRAWINGS

FIG. 1 is a schematic sectional view illustrating a color conversion film according to the first embodiment of the present invention.

FIG. 2 is a schematic sectional view illustrating a color conversion film according to the second embodiment of the present invention.

FIG. 3 is a schematic sectional view illustrating a color conversion film according to the third embodiment of the present invention.

FIG. 4 is a schematic sectional view illustrating a color conversion film according to the fourth embodiment of the present invention.

DETAILED DESCRIPTION OF EMBODIMENTS OF THE INVENTION

Preferred embodiments of the pyrromethene-boron complex, the color conversion composition, the color conversion film, the light source unit, the display, and the illumination device according to the present invention will be described in detail. However, the present invention is not limited to the following embodiments and can be performed with various modification based on the purpose or application.

<Pyrromethene-Boron Complex>

Pyrromethene-boron complexes according to the present invention will be described in detail. A pyrromethene-boron complex according to embodiments of the present invention is a color conversion material for forming, for example, a color conversion composition or a color conversion film. In particular, the pyrromethene-boron complex is a compound with a molecular weight of 1000 or more, represented by the general formula (1). In addition, at least two of $R^1$ to $R^6$ in the general formula (1) in the pyrromethene-boron complex are groups represented by the general formula (2) described later. Hereinafter, "a compound with a molecular weight of 1000 or more, represented by the general formula (1)" as a pyrromethene-boron complex according to the embodiments may be abbreviated as "a compound represented by the general formula (1).” First, focusing on a compound represented by the general formula (1), the pyrromethene-boron complex according to the embodiments will be described in detail.

[Chem 4]

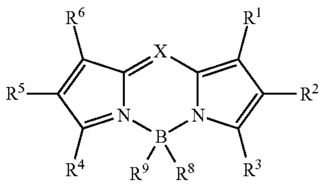

(1)

In the general formula (1), X is C—$R^7$ or N. $R^1$ to $R^9$, other than groups represented by the general formula (2) described below of $R^1$ to $R^6$, each are the same or different, and selected from the group consisting of hydrogen, alkyl, cycloalkyl, heterocyclyl, alkenyl, cycloalkenyl, alkynyl, hydroxy, thiol, alkoxy, alkylthio, aryl ether, aryl thioether, aryl, heteroaryl, halogen, cyano, aldehyde, carbonyl, carboxyl, acyl, ester, amide, carbamoyl, amino, nitro, silyl, siloxanyl, boryl, sulfoxide, sulfonyl, phosphine oxide, and a fused ring formed by adjacent substituents.

In all the groups described above, hydrogen may be heavy hydrogen. This applies equally to the compounds or their substructures described below. All the groups described above may be substituted or unsubstituted. Similarly, the compounds or their substructures described below may be substituted or unsubstituted. In the following description, for example, $C_{6-40}$ substituted or unsubstituted aryl group refers to an aryl group containing from 6 to 40 carbon atoms in total, including the carbon atoms contained in the substituents that have been replaced into the aryl group. This applies equally to other substituents with defined number of carbon atoms.

In all of the groups described above when they are substituted, preferred substituents include alkyl, cycloalkyl, heterocyclyl, alkenyl, cycloalkenyl, alkynyl, hydroxy, thiol, alkoxy, alkylthio, aryl ether, aryl thioether, aryl, heteroaryl, halogen, cyano, aldehyde, carbonyl, acyl, ester, amide, carboxyl, oxycarbonyl, carbamoyl, amino, nitro, silyl, siloxanyl, boryl, and phosphine oxide. Further preferred are specific substituents defined as preferable in the description of the substituents. These substituents may be further substituted by the above-described substituent.

The term “unsubstituted” in the description “substituted or unsubstituted” means that a hydrogen or heavy hydrogen atom is substituted. This applies equally to the compounds or their substructures described below with description “substituted or unsubstituted.”

Of all the groups described above, the term “alkyl” group represents a saturated aliphatic hydrocarbon group, such as methyl, ethyl, n-propyl, isopropyl, n-butyl, sec-butyl, or tert-butyl, which may be substituted or unsubstituted. When the group is substituted, any substituent may be added, including alkyl, halogen, aryl, or heteroaryl. This applies commonly to the following description. The number of carbon atoms in an alkyl group is not particularly restricted, and is preferably in a range from 1 to 20, more preferably in a range from 1 to 8, from the viewpoint of the availability and the cost.

The term “alkylene” group represents a group with a valence of two or more, derived from a saturated aliphatic hydrocarbon group, such as methyl or ethyl, which may be substituted or unsubstituted. Preferred examples of the alkylene group include methylene, ethylene, n-propylene, isopropylene, n-butylene, pentylene, and hexylene. The number of carbon atoms in an alkylene moiety is not particularly restricted, and is preferably in a range from 1 to 20, more preferably in a range from 1 to 6.

The term “cycloalkyl” group represents a saturated alicyclic hydrocarbon group, such as cyclopropyl, cyclohexyl, norbornyl, or adamantyl, which may be substituted or unsubstituted. The number of carbon atoms in an alkylene moiety is not particularly restricted, and is preferably in a range from 3 to 20.

The term “cycloalkylene” group represents a group with a valence of two or more, derived from a saturated alicyclic hydrocarbon group, such as cyclopropyl or cyclohexyl, which may be substituted or unsubstituted. Preferred examples of the cycloalkylene group include saturated alicyclic hydrocarbon groups, such as cyclopropylene, cyclohexylene, norbornylene, and adamantylene. The number of carbon atoms in a cycloalkylene moiety is not particularly restricted, and is preferably in a range from 3 to 20.

The term “heterocyclyl” group represents an aliphatic ring system having a non-carbon atom therein, such as pyran ring, piperidine ring, or cyclic amide, which may be substituted or unsubstituted. The number of carbon atoms in a heterocyclyl group is not particularly restricted, and is preferably in a range from 2 to 20.

The term “alkenyl” group represents an unsaturated aliphatic hydrocarbon group having a double bond, such as vinyl, allyl, or butadienyl, which may be substituted or unsubstituted. The number of carbon atoms in an alkenyl group is not particularly restricted, and is preferably in a range from 2 to 20.

The term “cycloalkenyl group” represents an unsaturated alicyclic hydrocarbon group having a double bond, such as cyclopentenyl, cyclopentadienyl, or cyclohexenyl, which may be substituted or unsubstituted. The number of carbon atoms in a cycloalkenyl group is not particularly restricted, and is preferably in a range from 3 to 20.

The term “alkynyl” group represents an unsaturated aliphatic hydrocarbon group having a triple bond, such as ethinyl, which may be substituted or unsubstituted. The number of carbon atoms in an alkynyl group is not particularly restricted, and is preferably in a range from 2 to 20.

The term “alkoxy” group represents a functional group bound to an aliphatic hydrocarbon group via an ether linkage, such as methoxy, ethoxy, or propoxy, which aliphatic hydrocarbon group may be substituted or unsubstituted. The number of carbon atoms in an alkoxy group is not particularly restricted, and is preferably in a range from 1 to 20.

The term “alkylthio” group refers to an alkoxy group with the oxygen atom in the ether linkage substituted by a sulfur atom. The hydrocarbon group in an alkylthio group may be substituted or unsubstituted. The number of carbon atoms in an alkylthio group is not particularly restricted, and is preferably in a range from 1 to 20.

The term “aryl ether” group represents a functional group bound to an aromatic hydrocarbon group via an ether linkage, such as phenoxy, which aromatic hydrocarbon group may be substituted or unsubstituted. The number of carbon atoms in an aryl ether group is not particularly restricted, and is preferably in a range from 6 to 40.

The term “aryl thioether” group refers to an aryl ether group with the oxygen atom in the ether linkage substituted by a sulfur atom. The aromatic hydrocarbon group in an aryl thioether group may be substituted or unsubstituted. The number of carbon atoms in an aryl thioether group is not particularly restricted, and is preferably in a range from 6 to 40.

The term "aryl" group represents an aromatic hydrocarbon group, such as phenyl, biphenyl, terphenyl, naphthyl, fluorenyl, benzofluorenyl, dibenzofluorenyl, phenanthryl, anthracenyl, benzophenanthryl, benzoanthracenyl, chrysenyl, pyrenyl, fluoranthenyl, triphenylenyl, benzofluoranthenyl, dibenzoanthracenyl, perylenyl, or helicenyl. Particularly preferred are phenyl, biphenyl, terphenyl, naphthyl, fluorenyl, phenanthryl, anthracenyl, pyrenyl, fluoranthenyl, and triphenylenyl. The aryl group may be substituted or unsubstituted. When the aryl group is substituted, the substituents may together form a ring structure. An example of the aryl group with the substituents together forming a ring structure includes spirofluorenyl. The number of carbon atoms in an aryl group is not particularly restricted, and is preferably in a range from 6 to 40, more preferably in a range from 6 to 30.

When $R^1$ to $R^9$ other than the group represented by the general formula (2) are each a substituted or unsubstituted aryl group, the aryl group is preferably phenyl, biphenyl, terphenyl, naphthyl, fluorenyl, phenanthryl, or anthracenyl, and more preferably phenyl, biphenyl, terphenyl, or naphthyl. Further preferably, the aryl group is phenyl, biphenyl, or terphenyl, and particularly preferably phenyl. The term "$R^1$ to $R^9$ other than the group represented by the general formula (2)" refers to "$R^1$ to $R^9$, other than the group represented by the general formula (2) (the group corresponding to at least two of $R^1$ to $R^6$)."

When each substituent is further substituted with an aryl group, the aryl group is preferably phenyl, biphenyl, terphenyl, naphthyl, fluorenyl, phenanthryl, or anthracenyl, and more preferably phenyl, biphenyl, terphenyl, or naphthyl. Particularly preferably, the aryl group is phenyl.

The term "heteroaryl" group represents a cyclic aromatic group having one or more non-carbon atom in the ring, such as pyridyl, furanyl, thienyl, quinolinyl, isoquinolinyl, pyrazinyl, pyrimidyl, pyridazinyl, triazinyl, naphthyridinyl, cinnolinyl, phthalazinyl, quinoxalinyl, quinazolinyl, benzofuranyl, benzothienyl, indolyl, dibenzofuranyl, dibenzothienyl, carbazolyl, benzocarbazolyl, carbolinyl, indolocarbazolyl, benzofurocarbazolyl, benzothienocarbazolyl, dihydroindenocarbazolyl, benzoquinolinyl, acridinyl, dibenzoacridinyl, benzimidazolyl, imidazopyridyl, benzooxazolyl, benzothiazolyl, or phenanthrolinyl. Here, the term "naphthyridinyl" group represents 1,5-naphthyridinyl, 1,6-naphthyridinyl, 1,7-naphthyridinyl, 1,8-naphthyridinyl, 2,6-naphthyridinyl, or 2,7-naphthyridinyl. The heteroaryl group may be substituted or unsubstituted. The number of carbon atoms in a heteroaryl group is not particularly restricted, and is preferably in a range from 2 to 40, more preferably in a range from 2 to 30.

When $R^1$ to $R^9$ other than the group represented by the general formula (2) are each a substituted or unsubstituted heteroaryl group, the heteroaryl group is preferably pyridyl, furanyl, thienyl, quinolinyl, pyrimidyl, triazinyl, benzofuranyl, benzothienyl, indolyl, dibenzofuranyl, dibenzothienyl, carbazolyl, benzimidazolyl, imidazopyridyl, benzooxazolyl, benzothiazolyl, or phenanthrolinyl, and more preferably pyridyl, furanyl, thienyl, or quinolinyl. Particularly preferably, the heteroaryl group is pyridyl.

When each substituent is further substituted with a heteroaryl group, the heteroaryl group is preferably pyridyl, furanyl, thienyl, quinolinyl, pyrimidyl, triazinyl, benzofuranyl, benzothienyl, indolyl, dibenzofuranyl, dibenzothienyl, carbazolyl, benzimidazolyl, imidazopyridyl, benzooxazolyl, benzothiazolyl, or phenanthrolinyl, and more preferably pyridyl, furanyl, thienyl, or quinolinyl. Particularly preferably, the heteroaryl group is pyridyl.

The term "halogen" represents an atom selected from fluorine, chlorine, bromine, and iodine. The carbonyl, carboxyl, oxycarbonyl, and carbamoyl groups may be substituted or unsubstituted. Here, examples of the substituent include alkyl, cycloalkyl, aryl, and heteroaryl, which may be further substituted. The number of carbon atoms in a carbonyl group is not particularly restricted, and is preferably in a range from 6 to 40.

The term "ester" group represents a functional group bound to, for example, alkyl, cycloalkyl, aryl, or heteroaryl, via an ester bond, which substituent may be further substituted. The number of carbon atoms in an ester group is not particularly restricted, and is preferably in a range from 1 to 20. More specifically, examples of the ester group include methyl ester such as methoxycarbonyl, ethyl ester such as ethoxycarbonyl, propyl ester such as propoxycarbonyl, butyl ester such as butoxycarbonyl, isopropyl ester such as isopropoxymethoxycarbonyl, hexyl ester such as hexyloxycarbonyl, and phenyl ester such as phenoxycarbonyl.

The term "amide" group represents a functional group bound to a substituent such as alkyl, cycloalkyl, aryl, or heteroaryl, via an amide bond, which substituent may be further substituted. The number of carbon atoms in an amide group is not particularly restricted, and is preferably in a range from 1 to 20. More specifically, examples of the amide group include methylamide, ethylamide, propylamide, butylamide, isopropylamide, hexylamide, and phenylamide.

The term "amino" group refers to a substituted or unsubstituted amino group. An amino group may be substituted or unsubstituted. Examples of the substituent when an amino group is substituted include aryl, heteroaryl, linear alkyl, and branched alkyl. Preferred aryl and heteroaryl groups are phenyl, naphthyl, pyridyl, and quinolinyl. These substituents may be further substituted. The number of carbon atoms is not particularly restricted, and is preferably in a range from 2 to 50, more preferably in a range from 6 to 40, particularly preferably in a range from 6 to 30.

The term "silyl" group represents alkylsilyl, such as trimethylsilyl, triethylsilyl, tert-butyldimethylsilyl, propyldimethylsilyl, or vinyldimethylsilyl; or arylsilyl, such as phenyldimethylsilyl, tert-butyldiphenylsilyl, triphenylsilyl, or trinaphthylsilyl. A substituent on silicon may be further substituted. The number of carbon atoms in a silyl group is not particularly restricted, and is preferably in a range from 1 to 30.

The term "siloxanyl" group represents a silicon compound group via an ether linkage, such as trimethylsiloxanyl. A substituent on silicon may be further substituted. The number of carbon atoms in a siloxanyl group is not particularly restricted, and is preferably in a range from 1 to 30. The term "boryl" group refers to a substituted or unsubstituted boryl group. A boryl group may be substituted or unsubstituted. Examples of the substituent when a boryl group is substituted include aryl, heteroaryl, linear alkyl, branched alkyl, aryl ether, alkoxy, and hydroxyl. Particularly preferred are aryl and aryl ether. The number of carbon atoms in a boryl group is not particularly restricted, and is preferably in a range from 1 to 30.

The term "acyl" group represents a functional group bound to a substituent such as alkyl, cycloalkyl, aryl, or heteroaryl, via a carbonyl bond, which substituent may be further substituted. The number of carbon atoms in an acyl group is not particularly restricted, and is preferably in a range from 1 to 20. More specifically, examples of the acyl group include acetyl, propionyl, benzoyl, and acrylyl.

The term "sulfonyl" group represents a functional group bound to a substituent such as alkyl, cycloalkyl, aryl, or heteroaryl, via a $-S(=O)_2-$ bond, which substituent may be further substituted. The number of carbon atoms in a sulfonyl group is not particularly restricted, and is preferably in a range from 1 to 30.

The term "sulfoxide" group represents a functional group bound to a substituent such as alkyl, cycloalkyl, aryl, or heteroaryl, via a $-S(=O)-$ bond, which substituent may be further substituted. The number of carbon atoms in a sulfoxide group is not particularly restricted, and is preferably in a range from 1 to 30.

The term "phosphine oxide" group refers to a group represented by $-P(=O)R^{10}R^{11}$. $R^{10}$ and $R^{11}$ in a phosphine oxide group are selected similarly as $R^1$ to $R^9$ in the general formula (1). The number of carbon atoms in a phosphine oxide group is not particularly restricted, and is preferably in a range from 1 to 30.

A compound represented by the general formula (1) has a pyrromethene-boron complex backbone. The pyrromethene-boron complex backbone is rigid and highly planar. Thus, a compound represented by the general formula (1) having a pyrromethene-boron complex backbone exhibits high fluorescence quantum yield and an emission spectrum with small full width at half peak maximum. Therefore, a compound represented by the general formula (1) can achieve highly efficient color conversion and high color purity.

The pyrromethene-boron complex according to embodiments of the present invention is a compound represented by the general formula (1) with a molecular weight of 1000 or more. In the case where the pyrromethene-boron complex is a compound represented by the general formula (1) but having a molecular weight of less than 1000, the use of the pyrromethene-boron complex as a resin composition may result in active molecular migration within the resin and aggregation of molecules, which may cause quenching. Thus, it is difficult using the pyrromethene-boron complex to achieve both improved color reproduction and high durability. Therefore, the molecular weight of the pyrromethene-boron complex according to the present invention should be 1000 or more. The molecular weight of the pyrromethene-boron complex according to the present invention is preferably 1200 or more, more preferably 1600 or more, particularly preferably 2000 or more.

When the pyrromethene-boron complex is used as a resin composition, the molecular weight of the pyrromethene-boron complex according to the present invention is preferably 10000 or less, from the viewpoint of improving the solubility in binder resins and solvents, and further improving the quantum yield and the durability. In addition, the molecular weight of the pyrromethene-boron complex according to the present invention is more preferably 7000 or less, particularly preferably 5000 or less, from the viewpoint as described above.

Preferably, in the general formula (1), at least one of $R^1$, $R^3$, $R^4$, and $R^6$ is alkyl or cycloalkyl. This is because when at least one of $R^1$, $R^3$, $R^4$, and $R^6$ is any of the groups described above, the compound represented by the general formula (1) exhibits better thermal stability and photostability as compared with the case where all $R^1$, $R^3$, $R^4$, and $R^6$ are hydrogen atoms.

When in the general formula (1), at least one of $R^1$, $R^3$, $R^4$, and $R^6$ is alkyl or cycloalkyl, the compound represented by the general formula (1) exhibits light emission with excellent color purity. In this case, the alkyl group preferably is a $C_{1-6}$ alkyl group such as methyl, ethyl, n-propyl, isopropyl, n-butyl, sec-butyl, tert-butyl, pentyl, or hexyl. Preferably, the cycloalkyl group is a saturated alicyclic hydrocarbon group such as cyclopropyl, cyclohexyl, norbornyl, or adamantyl. The cycloalkyl group may be substituted or unsubstituted. The number of carbon atoms in an alkyl moiety in the cycloalkyl group is not particularly restricted, and is preferably in a range from 3 to 20.

Preferably, the alkyl group in the general formula (1) is methyl, ethyl, n-propyl, isopropyl, n-butyl, sec-butyl, or tert-butyl from the viewpoint of excellent thermal stability. More preferably, the alkyl group is a sterically bulky tert-butyl group from the viewpoint of preventing concentration quenching and improving the fluorescence quantum yield. A methyl group is also preferably used as the alkyl group from the viewpoint of ease of synthesis and availability of the raw materials. An alkyl group in the general formula (1) means both a substituted or unsubstituted alkyl group and an alkyl moiety in a substituted or unsubstituted cycloalkyl group.

In the general formula (1), all $R^1$, $R^3$, $R^4$, and $R^6$ may be the same as or different from each other, and preferably are each alkyl or cycloalkyl. This is because in this case, the solubility of the compound represented by the general formula (1) in binder resins and solvents is improved. Preferably, the alkyl group in the general formula (1) is methyl from the viewpoint of ease of synthesis and availability of the raw materials.

Preferably, in the general formula (1), at least one of $R^1$, $R^3$, $R^4$, and $R^6$ is aryl or heteroaryl. In this case, the compound represented by the general formula (1) has improved photostability. The aryl group in the general formula (1) is preferably phenyl, biphenyl, terphenyl, or naphthyl, and especially, is more preferably phenyl or biphenyl, and particularly preferably phenyl. The heteroaryl group in the general formula (1) is preferably pyridyl, quinolinyl, or thienyl, and especially, is more preferably pyridyl or quinolinyl, and particularly preferably pyridyl.

In the general formula (1), all $R^1$, $R^3$, $R^4$, and $R^6$ may be the same as or different from each other, and preferably are each aryl or heteroaryl. This is because in this case, the thermal stability and the photostability of the compound represented by the general formula (1) are improved.

More preferably, in the general formula (1), at least one of $R^1$ and $R^6$ is an organic group with a number of carbon atoms of 2 or more. The pyrromethene-boron complex according to the present invention performs light color conversion by excitation with an excitation light and emission of light having different wavelength from the excitation light. When at least one of $R^1$ and $R^6$ on the pyrromethene-boron complex backbone is an organic group with a number of carbon atoms of 2 or more, the bulky organic group allows for steric protection of the meso position of the pyrromethene-boron complex. This can prevent quenching due to oxidation at the meso position in the pyrromethene-boron complex, caused by the interaction with oxygen contained in the color conversion composition during repeated excitation-emission cycles in the pyrromethene-boron complex, thereby further improving the durability. Preferably, such organic group having a number of carbon atoms of 2 or more is ethyl, n-propyl, isopropyl, n-butyl, sec-butyl, tert-butyl, pentyl, hexyl, cyclopropyl, cyclobutyl, cyclopentyl, cyclohexyl, norbornyl, or adamantyl. Especially, more preferred is isopropyl, tert-butyl, or cyclohexyl from the viewpoint of further improving the durability. The substituents may be substituted or unsubstituted.

Next, focusing on a group represented by the general formula (2), the pyrromethene-boron complex according to the embodiments of the present invention will be described in detail. In the embodiments, at least two of $R^1$ to $R^6$ in the general formula (1) described above are groups represented by the following general formula (2), from the viewpoint of improving the durability of the pyrromethene-boron complex. In particular, preferably two of $R^1$ to $R^6$ are groups represented by the general formula (2), and more preferably $R^2$ and $R^5$ are each a group represented by the general formula (2). In the general formula (2), the black dot in the left of $L^1$ represents a carbon atom bound to $R^1$ to $R^6$.

[Chem 5]

$$\bullet\!-\!L^1\!-\!L^2\!-\!\left(\!-\!(R^{101})_n\right)_m \qquad (2)$$

In the general formula (2), $L^1$, each independently, is selected from the group consisting of oxygen, nitrogen, sulfur, alkenylene, cycloalkenylene, arylene, heteroarylene, carbonyl, —C(═O)O—, —C(═O)N<, imino group, —$S(═O)_2$—, and —P(═O)<. $L^2$, each independently, is selected from the group consisting of alkylene, cycloalkylene, arylene, heterocyclyl, and heteroarylene. When $L^2$ is alkylene, the carbon atom bound to $L^1$, in the alkylene group, is secondary carbon or tertiary carbon. $R^{101}$, each independently, is selected from the group consisting of cyano, aryl, and cycloalkyl. n is each independently an integer of 0 to 5, and m is each independently an integer of 1 to 5. m-($L^2$-$(R^{101})_n$) each comprises three or more ring structures.

The term "alkenylene" group represents a group with a valence of two or more, derived from an unsaturated aliphatic hydrocarbon group having a double bond, such as vinyl, allyl, or butadienyl, which may be substituted or unsubstituted. Preferred examples of the alkenylene group include vinylene, propynylene, and butadienylene. The number of carbon atoms in an alkenylene moiety is not particularly restricted, and is preferably in a range from 2 to 20.

The term "arylene" group represents a group with a valence of two or more, derived from an aromatic hydrocarbon group, such as benzene, naphthalene, biphenyl, terphenyl, fluorene, or phenanthrene, which may be substituted or unsubstituted. Preferably, the arylene group is divalent or trivalent. Specific examples of the arylene group include phenylene, biphenylene, and naphthylene. The number of carbon atoms in an arylene group is not particularly restricted, and is preferably in a range from 1 to 30.

The term "heteroarylene" group represents a group with a valence of two or more, derived from an aromatic group having one or more non-carbon atom in the ring, such as pyridine, quinoline, pyrimidine, pyrazine, triazine, quinoxaline, quinazoline, dibenzofuran, or dibenzothiophene, which may be substituted or unsubstituted. Preferably, the heteroarylene group is divalent or trivalent. The number of carbon atoms in a heteroarylene group is not particularly restricted, and is preferably in a range from 2 to 30. Specific examples of the heteroarylene group include 2,6-pyridylene, 2,5-pyridylene, 2,4-pyridylene, 3,5-pyridylene, 3,6-pyridylene, 2,4,6-pyridylene, 2,4-pyrimidinylene, 2,5-pyrimidinylene, 4,6-pyrimidinylene, 2,4,6-pyrimidinylene, 2,4,6-triazinylene, 4,6-dibenzofuranylene, 2,6-dibenzofuranylene, 2,8-dibenzofuranylene, and 3,7-dibenzofuranylene.

The term "imino" group refers to a substituted or unsubstituted imino group. The term "imino" group represents a functional group bound to a substituent such as alkyl, cycloalkyl, aryl, or heteroaryl, via a —NH— bond, which substituent may be further substituted. In particular, a substituted imino group represents a —NH— bond with the hydrogen moiety substituted. The number of carbon atoms in an imino group is not particularly restricted, and is preferably in a range from 2 to 50, more preferably in a range from 6 to 40, particularly preferably in a range from 6 to 30.

$L^1$ may also be a combination of arbitrary two or more linking groups of the linking groups as $L^1$ described above. For example, a linking group in which an arylene group and an oxygen atom are linked may be considered as $L^1$.

In the general formula (2), n is an integer of 0 to 5, and m is an integer of 1 to 5. $R^{101}$ enclosed with n are independent for each possible integer as n, and may be the same as or different from each other. When n is from 2 to 5, n $R^{101}$ may be the same as or different from each other. When m is from 2 to 5, m-($L^2$-$(R^{101})_n$) may be the same as or different from each other.

In the general formula (2), the integer m is preferably 1 or 2, more preferably 1. In the general formula (2), the integer n is preferably 1 to 3, more preferably from 2 to 3. Further preferably, in the general formula (2), m=1 and n=2, or m=1 and n=3.

When $L^2$ is a substituted or unsubstituted alkylene group, the atom bound directly to $L^1$ in the alkylene group is secondary carbon or tertiary carbon. The position of $L^2$ bound directly to $L^1$ in the alkylene group is a substitution position that has a significant effect on the interaction between molecules. When the carbon bound directly to $L^1$ in the alkylene group is primary carbon, $L^1$-$L^2$, which is sterically vacant, tends to make it easier for molecules to interact with each other and be aggregated. On the other hand, the carbon bound directly to $L^1$ in the alkylene group is secondary or tertiary carbon, $L^1$-$L^2$, due to the steric repulsion at the linking site, make it difficult for molecules to interact with each other, and can prevent the molecules from being aggregated. This allows the compound represented by the general formula (1) to have further improved durability.

In the general formula (2), m-($L^2$-$(R^{101})_n$) each comprises three or more ring structures. Examples of the ring structures include single ring structure, fused ring structure, and spiro structure. Specifically, $L^2$ preferably is a group selected from the group consisting of substituted or unsubstituted cycloalkylene, substituted or unsubstituted arylene, and substituted or unsubstituted heteroarylene. More preferably, $L^2$ is substituted or unsubstituted arylene. Preferably, $R^{101}$ is a group selected from the group consisting of cyano, substituted or unsubstituted cycloalkyl, substituted or unsubstituted aryl, and substituted or unsubstituted heteroaryl. As the substituted aryl group, those listed above as aryl group, as well as fluorenyl and spirofluorenyl, in which the substituents together form a ring structure, can be selected. More preferably, $R^{101}$ is cyano, substituted or unsubstituted cycloalkyl, or substituted or unsubstituted aryl group. Still more preferably, $R^{101}$ is substituted or unsubstituted aryl.

In addition, in the general formula (2), for example, when m is 1, one -($L^2$-$(R^{101})_n$) comprises three or more ring structures, and when m is any of 2 to 5, m-($L^2$-$(R^{101})_n$) each comprise three or more ring structures, from the viewpoint of improving the durability. The number of ring structures is considered to be one for an independent ring structure; one ring structure for fused ring compounds; and one for a spiro structure. Specific examples of the independent ring structure include benzene ring, naphthalene ring, anthracene ring, pyrene ring, pyridine ring, cycloalkyl, and spirofluorenyl. As for a biphenyl structure, in which two benzene rings are covalently linked with a single bond, it is considered to have two ring structures.

In the general formula (2), m-($L^2$-($R^{101}$)$_n$), which each comprise a ring structure, are sterically bulky as compared with the case without ring structure, which can prevent molecules from being aggregated, resulting in improved durability of the compound represented by the general formula (1). This is probably because cyclic compounds comprising a ring structure have reduced degree of freedom due to their ring structure, and can inhibit molecular migration within a resin. Thus, -($L^2$-($R^{101}$)n) in the general formula (2) acts as a steric hindrance group, which prevents pyrromethene-boron complexes from interacting with each other, resulting in further improved stability. Preferably, the number of ring structures is from 3 to 20 for each possible integer as m.

More preferably, -($L^2$-($R^{101}$)n) in the general formula (2) is a group represented by the general formula (4), from the viewpoint of improving the durability. -($L^2$-($R^{101}$)n) in the general formula (2), which is a group represented by the general formula (4), can thereby further prevent molecular aggregation. This allows for the compound represented by the general formula (1) to have further improved durability. $R^{201}$ to $R^{205}$ in the group represented by the general formula (4), are each selected from the group consisting of $R^{101}$, fluorine-containing alkyl, alkyl, hydroxy, thiol, alkoxy, alkylthio, aryl ether, aryl thioether, halogen, aldehyde, carbonyl, carboxyl, acyl, ester, amide, carbamoyl, amino, nitro, silyl, siloxanyl, boryl, sulfoxide, sulfonyl, phosphine oxide, and hydrogen. Preferably, in the group represented by the general formula (4), at least one of $R^{201}$ to $R^{205}$ is $R^{101}$. More preferably, two of $R^{201}$ to $R^{205}$ are $R^{101}$, and particularly preferably, three of $R^{201}$ to $R^{205}$ are $R^{101}$.

[Chem 6]

(4)

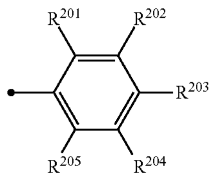

Preferably, in the general formula (4), at least one of $R^{201}$ and $R^{205}$ is aryl. When at least one of $R^{201}$ and $R^{205}$ is aryl, it is difficult for the group represented by the general formula (4) to interact with other molecules, which can prevent molecular aggregation. This allows for the compound represented by the general formula (1) to have improved durability.

More preferably, in the general formula (4), $R^{201}$ and $R^{205}$ are aryl. When $R^{201}$ and $R^{205}$ are aryl, the group represented by the general formula (4) can have further improved durability. $R^{201}$ and $R^{205}$ may be the same as or different from each other.

Preferably, in the general formula (2), $L^1$, each independently, is selected from the group consisting of carbonyl, —C(═O)O—, —C(═O)N<, —S(═O)$_2$—, and —P(═O)<. This is because these groups are chemically resistant to degradation. In this case, in the general formula (2), n is each independently an integer of 0 to 5, and m is each independently 1 or 2.

Especially, more preferred $L^1$ includes carbonyl, —C(═O)O—, —C(═O)N<, or —S(═O)$_2$—. This is because these groups prevent concentration quenching, leading to an effect of improving the fluorescence quantum yield.

When $L^1$ is carbonyl, —C(═O)O—, —C(═O)N<, —S(═O)$_2$—, or —P(═O)<, specific examples of the group represented by the general formula (2) include the groups represented by the general formulae (5) to (9).

[Chem 7]

(5)

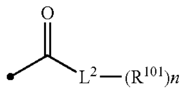

(6)

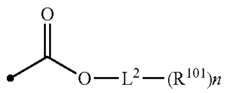

(7)

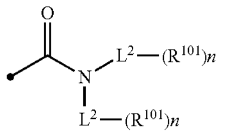

(8)

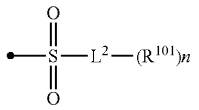

(9)

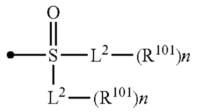

Preferably, in at least one general formula (2) of the plurality of general formulae (2) representing at least two of $R^1$ to $R^6$ in the general formula (1) as described above, n is from 1 to 5, and at least one $R^{101}$ has a group comprising a fluorine atom. The pyrromethene-boron complex according to the present invention performs light color conversion by excitation with an excitation light and emission of light having different wavelength from the excitation light. Since a fluorine atom has strong electron-attracting properties, when at least one $R^{101}$ has a group comprising a fluorine atom as described above, the electron density of the pyrromethene-boron complex backbone can be lowed. This allows for the compound represented by the general formula (1) to have improved stability against oxygen and further improved durability.

From the above, when the compound represented by the general formula (1) has a pyrromethene-boron complex backbone and a group comprising a fluorine atom in the molecule, the compound can have highly efficient emission and high color purity, as well as high durability.

Preferably, when X in the general formula (1) is C—$R^7$, $R^7$ is aryl or heteroaryl from the viewpoint of improving the durability. Especially preferably, $R^7$ is aryl from the viewpoint of photostability. Specifically, $R^7$ is preferably phenyl, biphenyl, terphenyl, or naphthyl, and more preferably phenyl, biphenyl, or terphenyl.

From the viewpoints of increasing the compatibility with solvents and of improving the emission efficiency, the substituent when $R^7$ is substituted is preferably alkyl or alkoxy, and more preferably methyl, ethyl, isopropyl, tert-butyl, or methoxy. Among these substituents, particularly preferably, the substituent is tert-butyl or methoxy from the viewpoint of dispersibility. This is because it can prevent quenching due to molecular aggregation.

A preferred example of $R^7$ include phenyl. Specifically, examples include phenyl, 2-tolyl, 3-tolyl, 4-tolyl, 2-methoxyphenyl, 3-methoxyphenyl, 4-methoxyphenyl, 4-ethylphenyl, 4-n-propylphenyl, 4-isopropylphenyl, 4-n-butylphenyl, 4-t-butylphenyl, 2,4-xylyl, 3,5-xylyl, 2,6-xylyl, 2,4-dimethoxyphenyl, 3,5-dimethoxyphenyl, 2,6-dimethoxyphenyl, 2,4,6-trimethylphenyl (mesityl), 2,4,6-trimethoxyphenyl, and fluorenyl.

Preferably, the substituent when $R^7$ is substituted is an electron-attracting group from the viewpoint of improving the stability against oxygen and thereby improving the durability of the compound represented by the general formula (1). Preferred examples of the electron-attracting group include fluorine, fluorine-containing alkyl, acyl, ester, amide, sulfonyl, nitro, silyl, cyano, and aromatic heterocyclyl.

Additional preferred examples of $R^7$ include fluorophenyl, trifluoromethylphenyl, carboxylatephenyl, acylphenyl, amidophenyl, sulfonylphenyl, nitrophenyl, silylphenyl, and benzonitrile. More specifically, examples include 2-fluorophenyl, 3-fluorophenyl, 4-fluorophenyl, 2,3-difluorophenyl, 2,4-difluorophenyl, 2,5-difluorophenyl, 2,6-difluorophenyl, 3,5-difluorophenyl, 2,3,4-trifluorophenyl, 2,3,5-trifluorophenyl, 2,4,5-trifluorophenyl, 2,4,6-trifluorophenyl, 2,3,4,5-tetrafluorophenyl, 2,3,4,6-tetrafluorophenyl, 2,3,5,6-tetrafluorophenyl, 2,3,4,5,6-pentafluorophenyl, 2-trifluoromethylphenyl, 3-trifluoromethylphenyl, 4-trifluoromethylphenyl, 2,3-bis(trifluoromethyl)phenyl, 2,4-bis(trifluoromethyl)phenyl, 2,5-bis(trifluoromethyl)phenyl, 2,6-dibis(trifluoromethyl)phenyl, 3,5-bis(trifluoromethyl) phenyl, 2,3,4-tris(trifluoromethyl)phenyl, 2,3,5-tris (trifluoromethyl)phenyl, 2,4,5-tris(trifluoromethyl)phenyl, 2,4,6-tris(trifluoromethyl)phenyl, 2,3,4,5-tetrakis(trifluoromethyl)phenyl, 2,3,4,6-tetrakis(trifluoromethyl)phenyl, 2,3,5,6-tetrakis(trifluoromethyl)phenyl, 2,3,4,5,6-penta(trifluoromethyl)phenyl, 2-methoxycarbonylphenyl, 3-methoxycarbonylphenyl, 4-methoxycarbonylphenyl, 3,5-bis(methoxycarbonyl)phenyl, 4-nitrophenyl, 4-trimethylsilylphenyl, 3,5-bis(trimethylsilyl)phenyl, and 4-benzonitrile. Especially, more preferred examples are 3-methoxycarbonylphenyl, 4-methoxycarbonylphenyl, 3,5-bis(methoxycarbonyl)phenyl, 3-trifluoromethylphenyl, 4-trifluoromethylphenyl, and 3,5-bis(trifluoromethyl)phenyl.

In an additional preferred embodiment (first embodiment), the compound represented by the general formula (1) is a compound having the structure represented by the following general formula (3).

[Chem 8]

(3)

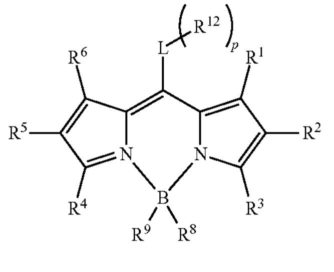

In the general formula (3), $R^1$ to $R^6$, $R^8$, and $R^9$ are the same as in the general formula (1). $R^{12}$, each independently, is aryl or heteroaryl for each possible integer as p. L is arylene or heteroarylene. p is an integer of 1 to 5. When p is from 2 to 5, $R^{12}$ may be the same as or different from each other.

The arylene or heteroarylene group contained as L in the compound represented by the general formula (3), which has appropriate bulkiness, can prevent molecular aggregation. This results in further improved emission efficiency and durability of the compound represented by the general formula (3).

Preferably, in the general formula (3), L is arylene from the viewpoint of photostability. When L is arylene, molecular aggregation can be prevented without impairing the emission wavelength. This allows for the compound represented by the general formula (3) to have improved durability. Specifically, the arylene group is preferably phenylene, biphenylene, or naphthylene.

Preferably, in the general formula (3), $R^{12}$ is aryl from the viewpoint of photostability. When $R^{12}$ is aryl, molecular aggregation can be prevented without impairing the emission wavelength. This allows for the compound represented by the general formula (3) to have improved durability. Specifically, the aryl group is preferably phenyl, biphenyl, terphenyl, or naphthyl, and more preferably phenyl, biphenyl, or terphenyl.

From the viewpoints of increasing the compatibility with solvents and of improving the emission efficiency, the substituent when L and $R^{12}$ are substituted is preferably alkyl or alkoxy, and more preferably methyl, ethyl, isopropyl, tert-butyl, or methoxy. Especially, the substituent is particularly preferably tert-butyl or methoxy from the viewpoint of dispersibility. This is because it can prevent quenching due to molecular aggregation.

A particularly preferred example of $R^{12}$ is phenyl from the viewpoint of substitution of such a group. Specifically, examples include phenyl, 2-tolyl, 3-tolyl, 4-tolyl, 2-methoxyphenyl, 3-methoxyphenyl, 4-methoxyphenyl, 4-ethylphenyl, 4-n-propylphenyl, 4-isopropylphenyl, 4-n-butylphenyl, 4-t-butylphenyl, 2,4-xylyl, 3,5-xylyl, 2,6-xylyl, 2,4-dimethoxyphenyl, 3,5-dimethoxyphenyl, 2,6-dimethoxyphenyl, 2,4,6-trimethylphenyl (mesityl), 2,4,6-trimethoxyphenyl, and fluorenyl.

Preferably, the substituent when L and $R^{12}$ are substituted is an electron-attracting group from the viewpoint of improving the stability against oxygen and thereby improving the durability of the compound represented by the general formula (3). Preferred examples of the electron-attracting group include fluorine, fluorine-containing alkyl, acyl, alkoxycarbonyl, aryloxycarbonyl, ester, amide, sulfonyl, nitro, silyl, cyano, or aromatic heterocyclyl.

From the viewpoint of substitution of the electron-attracting group, particularly preferred examples of $R^{12}$ include fluorophenyl, trifluoromethylphenyl, alkoxycarbonylphenyl, aryloxycarbonylphenyl, acylphenyl, amidophenyl, sulfonylphenyl, nitrophenyl, silylphenyl, and benzonitrile. More specifically, examples include fluorine, trifluoromethyl, cyano, methoxycarbonyl, amide, acyl, nitro, 2-fluorophenyl, 3-fluorophenyl, 4-fluorophenyl, 2,3-difluorophenyl, 2,4-difluorophenyl, 2,5-difluorophenyl, 2,6-difluorophenyl, 3,5-difluorophenyl, 2,3,4-trifluorophenyl, 2,3,5-trifluorophenyl, 2,4,5-trifluorophenyl, 2,4,6-trifluorophenyl, 2,3,4,5-tetrafluorophenyl, 2,3,4,6-tetrafluorophenyl, 2,3,5,6-tetrafluorophenyl, 2,3,4,5,6-pentafluorophenyl, 2-trifluoromethylphenyl, 3-trifluoromethylphenyl, 4-trifluoromethylphenyl, 2,3-bis(trifluoromethyl)phenyl, 2,4-bis(trifluoromethyl)phenyl, 2,5-bis(trifluoromethyl)phenyl, 2,6-dibis(trifluoromethyl)phenyl, 3,5-bis(trifluoromethyl)phenyl, 2,3,4-tris(trifluoromethyl)phenyl, 2,3,5-tris(trifluoromethyl)phenyl, 2,4,5-tris(trifluoromethyl)phenyl, 2,4,6-tris(trifluoromethyl)phenyl, 2,3,4,5-tetrakis(trifluoromethyl)phenyl, 2,3,4,6-tetrakis(trifluoromethyl)phenyl, 2,3,5,6-tetrakis(trifluoromethyl)phenyl, 2,3,4,5,6-penta(trifluoromethyl)phenyl, 2-methoxycarbonylphenyl, 3-methoxycarbonylphenyl, 4-methoxycarbonylphenyl, 3,5-bis(methoxycarbonyl)phenyl, 4-nitrophenyl, 4-trimethylsilylphenyl, 3,5-bis(trimethylsilyl)phenyl, and 4-benzonitrile group. Especially, more preferred examples are 4-methoxycarbonylphenyl and 3,5-bis(trifluoromethyl)phenyl.

From the viewpoints of providing higher fluorescence quantum yield, of being more unlikely to be pyrolyzed, and of photostability, L in the general formula (3) is preferably phenylene.

In the general formula (3), the integer p is preferably 1 or 2, more preferably 2. In other words, the compound represented by the general formula (3) preferably comprises one or two $R^{12}$, and more preferably two $R^{12}$. When the compound represented by the general formula (3) comprises one or two $R^{12}$, more preferably two, having a bulky substituent or an electron-attracting group, the compound represented by the general formula (3) can keep its fluorescence quantum yield high, while having improved durability. When the integer p is 2, $R^{12}$ may be the same as or different from each other.

In an additional preferred embodiment (second embodiment), the compound represented by the general formula (1) is a compound having the structure represented by the following general formula (10).

[Chem 9]

(10)

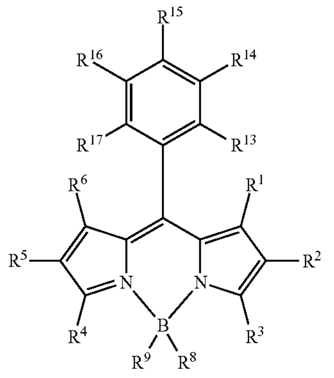

In the general formula (10), $R^1$ to $R^6$, $R^8$, and $R^9$ are the same as in the general formula (3). $R^{13}$ to $R^{17}$ are selected from the group consisting of aryl, heteroaryl, fluorine-containing alkyl, alkyl, hydroxy, thiol, alkoxy, alkylthio, aryl ether, aryl thioether, halogen, aldehyde, carbonyl, carboxyl, acyl, ester, amide, carbamoyl, amino, nitro, silyl, siloxanyl, boryl, sulfoxide, sulfonyl, phosphine oxide, and hydrogen. $R^{13}$ to $R^{17}$ may be the same as or different from each other.

Preferably, in the general formula (10), at least one of $R^{14}$ and $R^{16}$ is aryl or heteroaryl. When at least one of $R^{14}$ and $R^{16}$ is aryl or heteroaryl, the compound represented by the general formula (10) has an appropriate bulkiness and can prevent molecular aggregation. This allows for the compound represented by the general formula (10) to have further improved emission efficiency and durability.

More preferably, both $R^{14}$ and $R^{16}$ are aryl or heteroaryl. When both $R^{14}$ and $R^{16}$ is aryl or heteroaryl, the entire molecule of the compound represented by the general formula (10) is bulkier and can further prevent molecular aggregation. This allows for the compound represented by the general formula (10) to have still further improved emission efficiency and durability.

Preferably, in the general formula (10), at least one of $R^{13}$ and $R^{17}$ is aryl or heteroaryl. When at least one of $R^{13}$ and $R^{17}$ is aryl or heteroaryl, the compound represented by the general formula (10) is more unlikely to interact with other molecules and can prevent molecular aggregation. This allows for the compound represented by the general formula (10) to have further improved durability.

More preferably, both $R^{13}$ and $R^{17}$ are aryl or heteroaryl. When both $R^{13}$ and $R^{17}$ are aryl or heteroaryl, the compound represented by the general formula (10) can have still further improved durability. $R^{13}$ and $R^{17}$ may be the same as or different from each other.

Preferably, in the general formula (1), at least one of $R^8$ and $R^9$ is cyano.

More preferably, in the general formula (1), both $R^8$ and $R^9$ are cyano. In this case, since two cyano groups are introduced onto the boron atom in the pyrromethene-boron complex backbone, the electron density of the pyrromethene-boron complex backbone can be further lowered. This allows for the compound represented by the general formula (1) to have further improved stability against oxygen, resulting in significantly improved durability of the compound represented by the general formula (1).

In the general formula (1), $R^8$ and $R^9$ are preferably cyano as described above, and preferred groups other than cyano include alkyl, aryl, heteroaryl, alkoxy, aryloxy, fluorine, fluorine-containing alkyl, fluorine-containing heteroaryl, fluorine-containing aryl, fluorine-containing alkoxy, and fluorine-containing aryloxy. More preferably, $R^8$ and $R^9$ are each fluorine, fluorine-containing alkyl, fluorine-containing alkoxy, or fluorine-containing aryl, from the viewpoint of stability against the excitation light and higher fluorescence quantum yield. Especially, $R^8$ and $R^9$ are more preferably fluorine, from the viewpoint of ease of synthesis.

From the above, when the compound represented by the general formula (1) has a pyrromethene-boron complex backbone with a molecular weight of 1000 or more, the compound can achieve all of highly efficient emission, high color purity, and high durability. The compound represented by the general formula (1), which exhibits high fluorescence quantum yield and small full width at half peak maximum in the emission spectrum, can also achieve efficient color conversion and high color purity. In addition, introduction of an appropriate substituent to an appropriate position of the compound represented by the general formula (1) allows for adjustment of various characteristics and physical properties such as emission efficiency, color purity, thermal stability, photostability, and dispersibility.

Examples of the compound represented by the general formula (1) will be shown below, but it is not limited thereto.

[Chem 10]
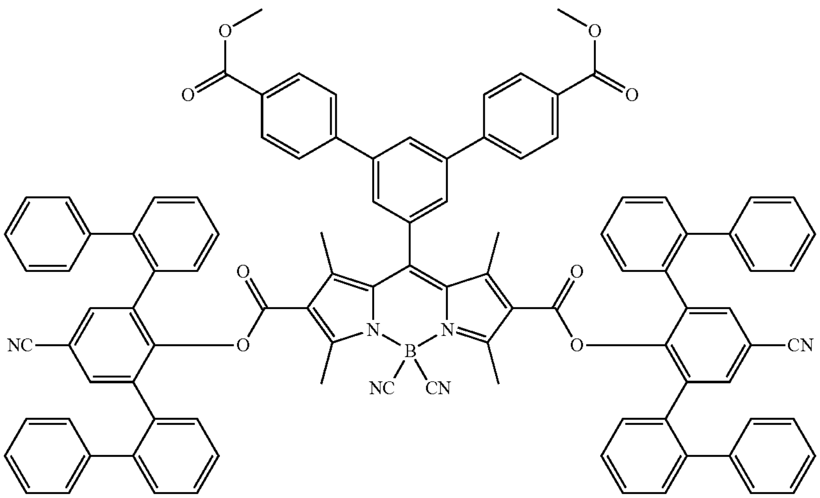
Molecular Weight: 1505.51
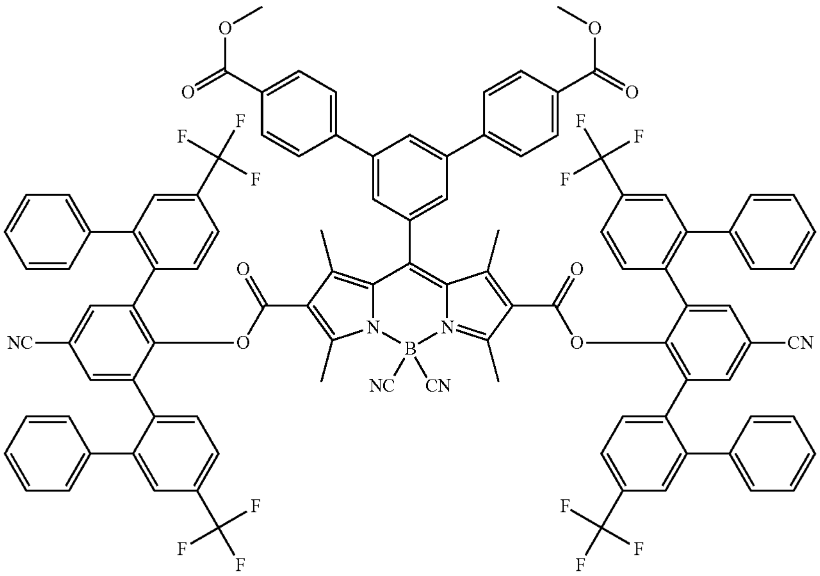
Molecular Weight: 1777.50

-continued
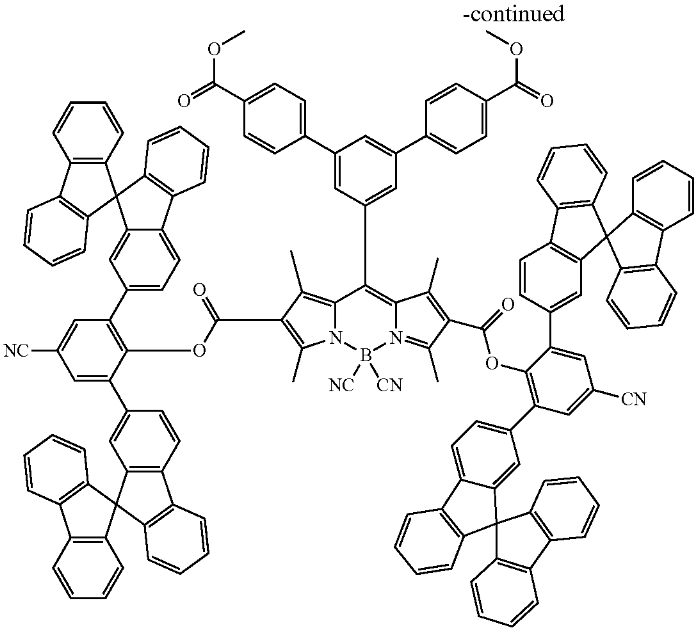
Molecular Weight: 2154.27
[Chem 11]
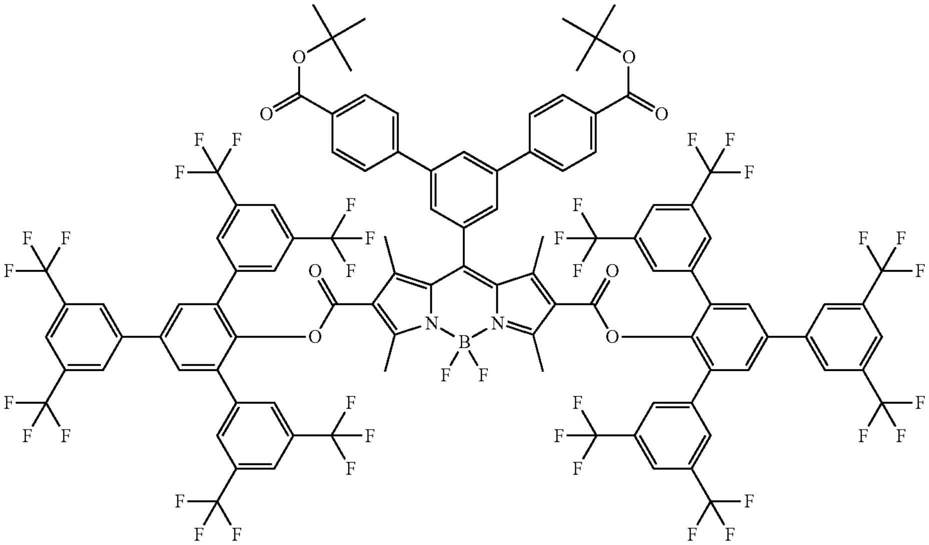
Molecular Weight: 2189.39

-continued
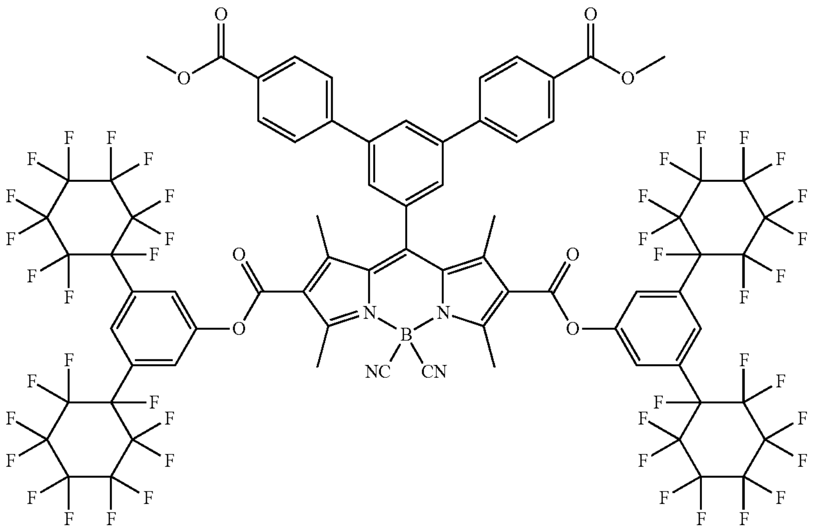
Molecular Weight: 1966.86
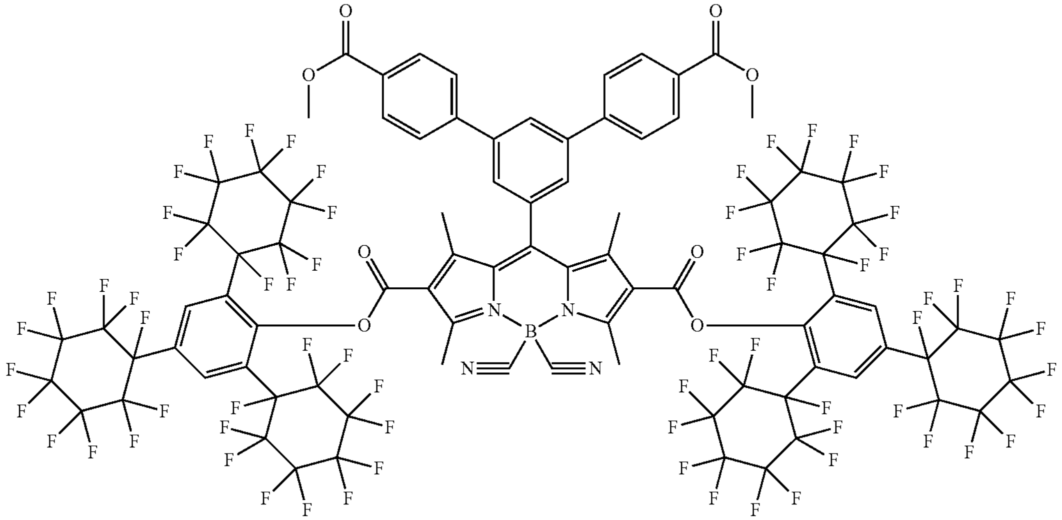
Molecular Weight: 2526.95

-continued

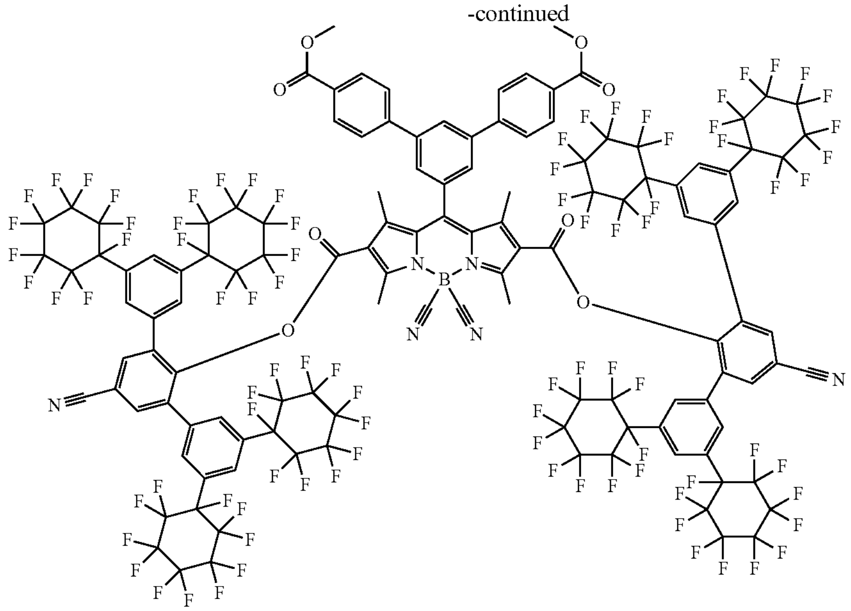

Molecular Weight: 3441.44

A compound represented by the general formula (1) can be produced by methods such as described in Japanese Translated PCT Patent Application Laid-open No. 1996-509471 and Japanese Laid-Open Patent Publication No. 2000-208262. In other words, a desired pyrromethene-boron complex can be obtained by reacting a pyrromethene compound and a halogenated boron under coexistence of a base.

As for synthesis of pyrromethene-fluorinated boron complexes, a compound represented by the general formula (1) can be synthesized by reference to methods such as described in J. Org. Chem., vol. 64, No. 21, pp. 7813-7819 (1999), and Angew. Chem., Int. Ed. Engl., vol. 36, pp. 1333-1335 (1997). For example, the methods include a method comprising: heating compounds represented by the following general formulae (11) and (12) in the presence of phosphorus oxychloride in 1,2-dichloroethane; and then reacting them with a compound represented by the following general formula (13) in the presence of triethylamine in 1,2-dichloroethane, thereby obtaining a compound represented by the general formula (1). However, the present invention is not limited thereto. Here, $R^1$ to $R^9$ are the same as described above. J represents halogen.

[Chem 12]

(11)

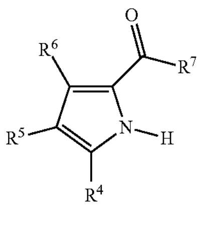

-continued (12)

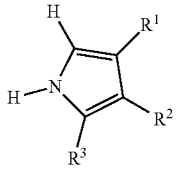

(13)

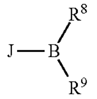

In addition, in the case of introduction of an aryl group or a heteroaryl group, a method may be used, comprising producing a carbon-carbon bond by using a coupling reaction of a halogenated derivative and boronic acid or a boronate derivative, but the present invention is not limited thereto. Similarly, in the case of introduction of an amino group or carbazolyl, for example, a method may be used comprising producing a carbon-nitrogen bond by using a coupling reaction of a halogenated derivative and an amine or carbazole derivative in the presence of a metal catalyst such as palladium, but the present invention is not limited thereto.

Preferably, the compound represented by the general formula (1) exhibits emission with a peak wavelength observed in a region of 500 nm or more and less than 580 nm by use of an excitation light. Hereinafter, the emission with a peak wavelength observed in a region of 500 nm or more and less than 580 nm is referred to as “green emission.”

Preferably, the compound represented by the general formula (1) exhibits a green emission by use of an excitation light with a wavelength ranging from 430 nm to 500 nm. In general, an excitation light having higher energy is more likely to cause decomposition of light emitting materials. The excitation light with a wavelength ranging from 430 nm to 500 nm, however, has relatively low excitation energy. This results in reduced decomposition of a light emitting material in a color conversion composition, providing green emission with good color purity.

Preferably, the compound represented by the general formula (1) exhibits emission with a peak wavelength observed in a region of 580 nm or more and 750 nm or less by use of an excitation light. Hereinafter, the emission with a peak wavelength observed in a region of 580 nm or more and 750 nm or less is referred to as “red emission.”

Preferably, the compound represented by the general formula (1) exhibits red emission by use of an excitation light with a wavelength ranging from 430 nm to 500 nm. In general, an excitation light having higher energy is more likely to cause decomposition of light emitting materials. The excitation light with a wavelength ranging from 430 nm to 500 nm, however, has relatively low excitation energy. This results in reduced decomposition of a light emitting material in a color conversion composition, providing red emission with good color purity.

<Color Conversion Composition>

A color conversion composition according to the present invention will be described in detail. The color conversion composition according to embodiments of the present invention converts an incident light from an emitter, such as a light source, into a light having a longer wavelength than the incident light, and preferably comprise the compound represented by the general formula (1) (pyrromethene-boron complex) described above and a binder resin.

The color conversion composition according to the present invention can appropriately contain other compounds in addition to the compound represented by the general formula (1), as necessary. For example, an assist dopant such as rubrene may be contained in order to further improve the energy transfer efficiency from an excitation light to the compound represented by the general formula (1). In order to add other emission colors other than the emission color of the compound represented by the general formula (1), desired organic light emitting materials, such as coumarin derivatives and rhodamine derivatives, can be added. In addition to organic light emitting materials, known light emitting materials, such as inorganic phosphors, fluorescent pigments, fluorescent dyes, and quantum dots, can be added in combination.

Examples of the organic light emitting materials other than the compound represented by the general formula (1) will be shown below, but the present invention is not limited thereto.

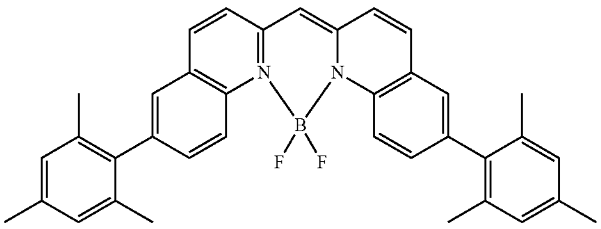
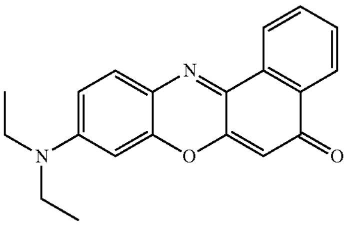
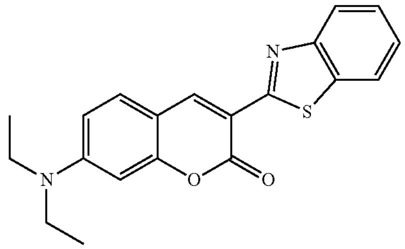
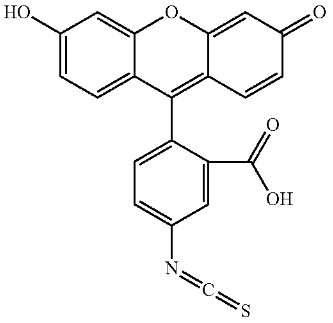
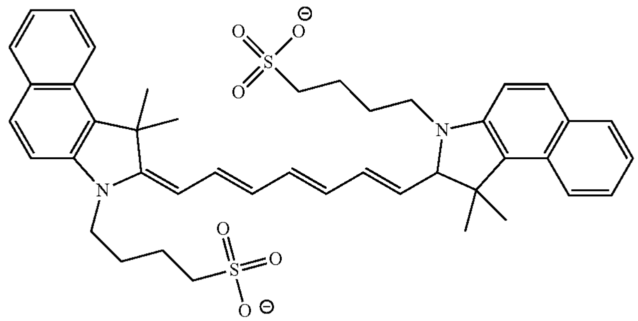
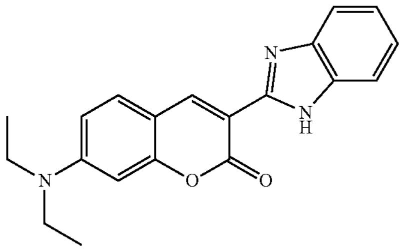

-continued
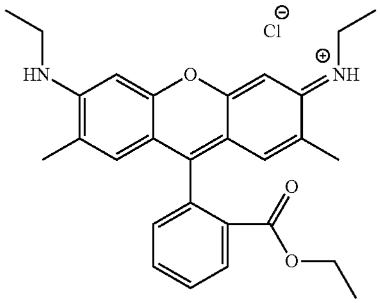
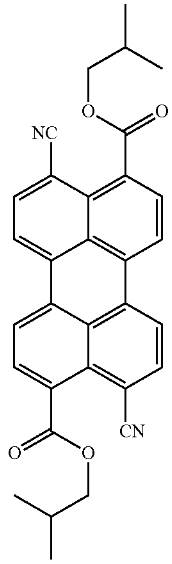
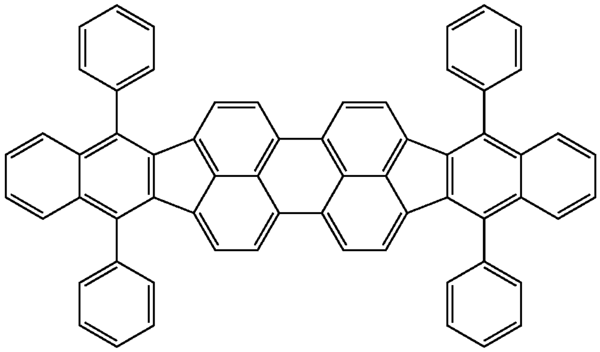
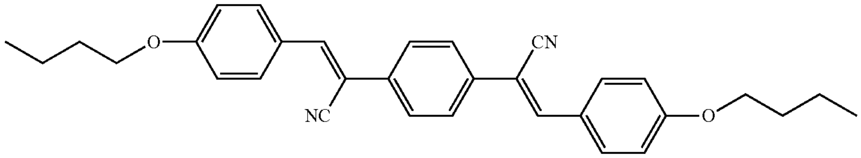
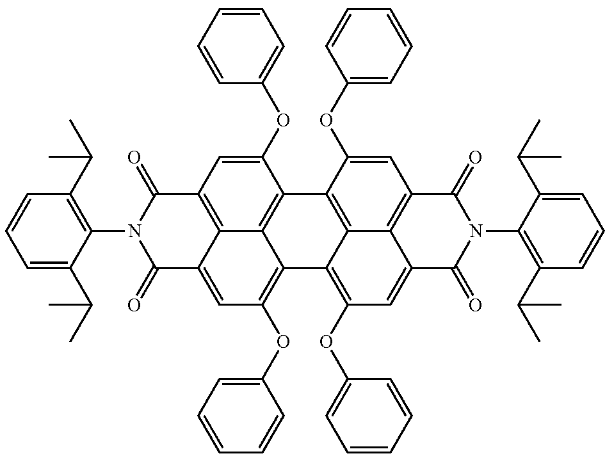
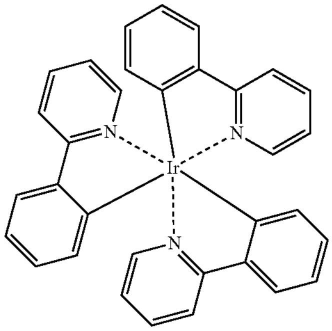

-continued

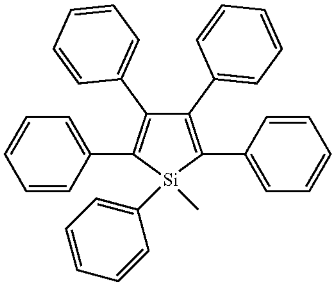

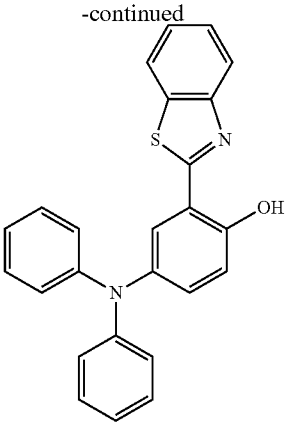

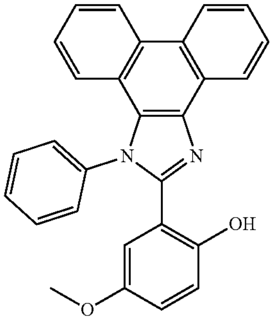

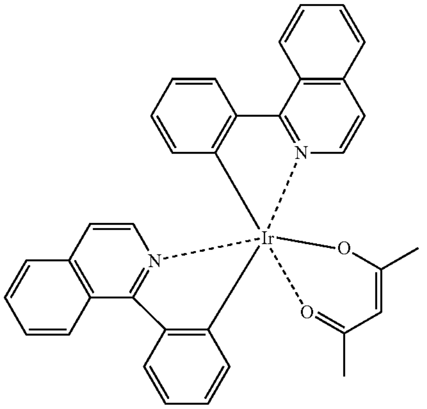

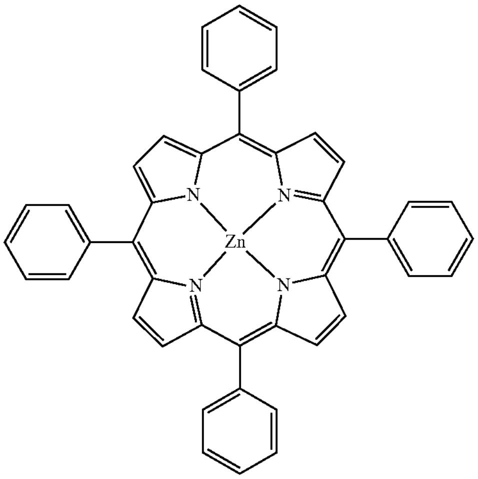

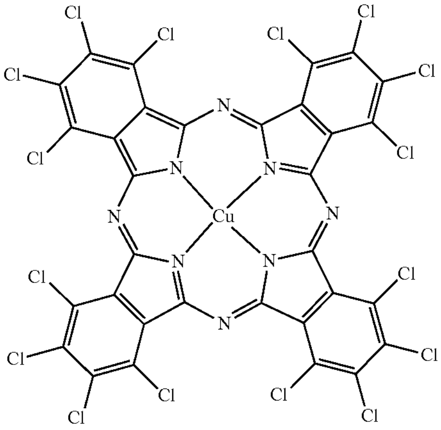

Preferably, in embodiments of the present invention, the color conversion composition exhibits a green emission by use of an excitation light. Preferably, the color conversion composition exhibits red emission by use of an excitation light.

Thus, preferably, the color conversion composition according to embodiments of the present invention contains light emitting material (a) and light emitting material (b) described below. The light emitting material (a) exhibits a green emission by use of an excitation light. The light emitting material (b) exhibits a red emission by excitation with at least one of an excitation light and an emission from the light emitting material (a). Preferably, at least one of the light emitting material (a) and light emitting material (b) is the compound represented by the general formula (1) (pyrromethene-boron complex). Preferably, the excitation light to be used has a wavelength ranging from 430 nm to 500 nm.

Since a part of the excitation light with a wavelength ranging from 430 nm to 500 nm pass partly through a color conversion film according to the present invention, sharp blue, green, and red emission spectra can be shown when using a blue LED having a sharp emission peak, giving a white light with good color purity. This allows for efficient generation of more vivid and larger color gamut, particularly in display. For illumination applications, as compared with white LEDs that combine blue LEDs and yellow phosphors, which are currently the mainstream, light emitting characteristics, especially in the green and red regions, are improved, making it possible to obtain a desirable white light source with improved color rendering properties.

Preferred examples of the light emitting material (a) include coumarin derivatives, such as coumarin 6, coumarin 7, and coumarin 153; cyanine derivatives, such as indocyanine green; fluorescein derivatives, such as fluorescein, fluorescein isothiocyanate, and carboxyfluorescein diacetate; phthalocyanine derivatives, such as phthalocyanine green; perylene derivatives, such as diisobutyl-4,10-dicyanoperylene-3,9-dicarboxylate; as well as pyrromethene derivatives; stilbene derivatives; oxazine derivatives; naphthalimide derivatives; pyrazine derivatives; benzimidazole derivatives; benzoxazole derivatives; benzothiazole derivatives; imidazopyridine derivatives; azole derivatives; compounds having a fused aryl ring and their derivatives, such as anthracene; aromatic amine derivatives; and organometallic complex compounds. However, the light emitting material (a) is not particularly limited to them. Among these compounds, pyrromethene derivatives, which achieve high fluorescence quantum yields and exhibit emission with high color purity, are particularly preferred. Among pyrromethene derivatives, compounds represented by the general formula (1), which significantly improve the durability, are preferred.

Preferred examples of the light emitting material (b) include cyanine derivatives, such as 4-dicyanomethylene-2-methyl-6-(p-dimethylaminostyryl)-4H-pyran; rhodamine derivatives, such as rhodamine B, rhodamine 6G, rhodamine 101, and sulforhodamine 101; pyridine derivatives, such as 1-ethyl-2-(4-(p-dimethylaminophenyl)-1,3-butadienyl)-pyridinium-perchlorate; perylene derivatives, such as N,N'-bis(2,6-diisopropylphenyl)-1,6,7,12-tetraphenoxyperylene-3,4:9,10-bisdicarbimide; as well as porphyrin derivatives; pyrromethene derivatives; oxazine derivatives; pyrazine derivatives; compounds having a fused aryl ring and their derivative, such as naphthacene and dibenzodiindenoperylene; and organometallic complex compounds. However, the light emitting material (b) is not particularly limited to them. Among these compounds, pyrromethene derivatives, which achieve high fluorescence quantum yields and exhibit emission with high color purity, are particularly preferred. Among pyrromethene derivatives, compounds represented by the general formula (1), which dramatically improve the durability, are preferred.

Preferably, both the light emitting material (a) and light emitting material (b) are compounds represented by the general formula (1), simultaneously allowing for achieving highly efficient emission and high color purity, as well as high durability.

The amount of the compound represented by the general formula (1) contained in the color conversion composition according to embodiments of the present invention varies depending on the molar extinction coefficient, fluorescence quantum yield, and absorption intensity at the excitation wavelength of the compound, as well as on the thickness and transmittance of the film to be prepared, and is usually from $1.0\times10^{-4}$ parts by weight to 30 parts by weight with respect to 100 parts by weight of the binder resin. The amount of the compound is further preferably from $1.0\times10^{-3}$ parts by weight to 10 parts by weight, and particularly preferably from $1.0\times10^{-2}$ parts by weight to 5 parts by weight, with respect to 100 parts by weight of the binder resin.

When the color conversion composition contains both a light emitting material (a) that exhibits a green emission and a light emitting material (b) that exhibits a red emission, the amounts of the light emitting materials (a) ($w_a$) and (b) ($w_b$) described above are preferably in a relationship of $w_a \geq w_b$ because of partial conversion of the green emission into a red emission. The ratio of the amounts of the light emitting material (a) and light emitting material (b) is $w_a:w_b$=1000:1 to 1:1, further preferably from 500:1 to 2:1, particularly preferably from 200:1 to 3:1. It is noted that the amounts $w_a$ and $w_b$ are in percent by weight with respect to the weight of the binder resin.

<Binder Resin>

Preferably, the binder resin forms a continuous phase and is a material having excellent moldability, transparency, heat resistance, and other properties. Examples of the binder resin include known binder resins, such as photocurable resist materials having reactive vinyl, such as acrylates, methacrylates, polyvinyl cinnamates, and cyclic rubbers; epoxy resins, silicone resins (including cured (crosslinked) organopolysiloxane, such as silicone rubber and silicone gel), urea resins, fluorine resins, polycarbonate resins, acrylic resins, urethane resins, melamine resins, polyvinyl resins, polyamide resins, phenolic resins, polyvinyl alcohol resins, cellulose resins, aliphatic ester resins, aromatic ester resins, aliphatic polyolefin resins, and aromatic polyolefin resins. The binder resin to be used may be a copolymer resin thereof. By appropriately designing such resins, binder resins that is useful in the color conversion composition and the color conversion film according to the present invention can be obtained. Among these resins, thermoplastic resins are further preferred from the viewpoint of ease of film formation process. Among thermosetting resins, an epoxy resin, a silicone resin, an acrylic resin, an ester resin, an olefin resin, or a combination thereof can be preferably used from the viewpoints of, for example, transparency and heat resistance. Acrylic resins, ester resins, and cycloolefin resins are particularly preferred thermoplastic resins from the viewpoint of durability.

The binder resin can also contain dispersants, leveling agents, and other agents for stabilization of the coating film as additives, or adhesion aids and other agents, such as silane coupling agents, as modifying agents for film surface. The binder resin can also contain inorganic particles such as silica particles or silicone microparticles as an anti-settling agent for the color conversion material.

In the color conversion composition for preparing the color conversion film according to the present invention, the binder resin is preferably blended with hydrosilylation reaction retardants, such as acetylene alcohol, as other components to prevent curing at room temperature and extend the pot life. The binder resin may also be blended with, for example, microparticles such as fumed silica, glass powder, and quartz powder, inorganic fillers and pigments, such as titanium oxide, zirconium oxide, barium titanate, and zinc oxide, flame retardants, heat resistance agents, antioxidants, dispersants, solvents, adhesiveness-imparting agents, such as silane coupling agents and titanium coupling agents, as necessary, without impairing the effect of the present invention.

<Other Components>

In addition to the compound represented by the general formula (1) and the binder resin described above, the color conversion composition according to the present invention may contain other components (additives) such as light stabilizers, antioxidants, processing and heat stabilizers, lightfastness stabilizers such as ultraviolet absorbers, silicone microparticles, and silane coupling agents.

Examples of the light stabilizers include, but not limited to, tertiary amines, catechol derivatives, and nickel compounds. These light stabilizers may be used alone or in combination.

Examples of the antioxidants include, but not limited to, phenolic antioxidants, such as 2,6-di-tert-butyl-p-cresol and 2,6-di-tert-butyl-4-ethylphenol. These antioxidants may be used alone or in combination.

Examples of the processing and heat stabilizers include, but not limited to, phosphorus-based stabilizers, such as tributyl phosphite, tricyclohexyl phosphite, triethyl phosphine, and diphenylbutyl phosphine. These stabilizers may be used alone or in combination.

Examples of the lightfastness stabilizers include, but not limited to, benzotriazoles such as 2-(5-methyl-2-hydroxyphenyl)benzotriazole, and 2-[2-hydroxy-3,5-bis(α,α-dimethylbenzyl)phenyl]-2H-benzotriazole. These lightfastness stabilizers may be used alone or in combination.

The amount of the additives contained in the color conversion composition according to the present invention varies depending on the molar extinction coefficient, fluorescence quantum yield, and absorption intensity at the excitation wavelength of the compound, as well as on the thickness and transmittance of the color conversion film to be prepared, and in usual is preferably from $1.0\times10^{-3}$ parts by weight to 30 parts by weight with respect to 100 parts by weight of the binder resin. The amount of the additives is more preferably from $1.0\times10^{-2}$ parts by weight to 15 parts by weight, and particularly preferably from $1.0\times10^{-1}$ parts by weight to 10 parts by weight, with respect to 100 parts by weight of the binder resin.

<Solvent>

The color conversion composition according to the present invention may contain solvents. Any solvents may be used, that can adjust the viscosity of fluid resins without excessively affecting the emission and durability of the light emitting substance. Examples of such solvents include toluene, methyl ethyl ketone, methyl isobutyl ketone, hexane, acetone, terpineol, texanol, methyl cellosolve, butyl carbitol, butyl carbitol acetate, and prolylene glycol monomethyl ether acetate. These solvents can be used alone or in combination of two or more. Especially among these solvents, toluene is preferably used because it does not affect the degradation of the compound represented by the general formula (1) and gives little residual solvent after drying.

<Method of Manufacturing Color Conversion Composition>

An example of the method of manufacturing the color conversion composition according to the present invention will be described. In the manufacturing method, predetermined amounts of the compound represented by the general formula (1), the binder resin, the solvent, and others described above are mixed. After mixing the components described above to a predetermined composition, the components were homogenously mixed and dispersed in an agitating/kneading machine, such as a homogenizer, a planetary centrifugal mixer, a three-roller, a ball mill, a planetary ball mill, or a bead mill, to obtain a color conversion composition. After or during the mixing and dispersion, deaeration is preferably carried out under vacuum or reduced pressure conditions. Pre-mixing of certain components, ageing, or other treatments may be performed. The solvent can also be removed using an evaporator to achieve a desired solid content concentration.

<Method of Preparing Color Conversion Film>

In embodiments of the present invention, there is no restriction on the structure of the color conversion film as long as it comprises a layer comprising the color conversion composition described above or a cured product thereof. Preferably, the cured color conversion composition is contained in the color conversion film as a layer obtained by curing the color conversion composition (a layer comprising the cured color conversion composition). Representative examples of the structure of the color conversion film include the following four structures.

FIG. 1 is a schematic sectional view illustrating a color conversion film according to the first embodiment of the present invention. As shown in FIG. 1, the color conversion film 1A in the first embodiment is a single layer film comprising a color conversion layer 11. The color conversion layer 11 is a layer comprising the cured color conversion composition described above.

FIG. 2 is a schematic sectional view illustrating a color conversion film according to the second embodiment of the present invention. As shown in FIG. 2, the color conversion film 1B in the second embodiment is a laminate of a substrate layer 10 and a color conversion layer 11. The structural example of the color conversion film 1B comprises the color conversion layer 11 laminated on the substrate layer 10.

FIG. 3 is a schematic sectional view illustrating a color conversion film according to the third embodiment of the present invention. As shown in FIG. 3, the color conversion film 1C in the third embodiment is a laminate of a plurality of substrate layers 10 and a color conversion layer 11. The structural example of the color conversion film 1C comprises the color conversion layer 11 sandwiched between the plurality of substrate layers 10.

FIG. 4 is a schematic sectional view illustrating a color conversion film according to the fourth embodiment of the present invention. As shown in FIG. 4, the color conversion film 1D in the fourth embodiment is a laminate of a plurality of substrate layers 10, a color conversion layer 11, and a plurality of barrier films 12. The structural example of the color conversion film 1D comprises the color conversion layer 11 sandwiched between the plurality of barrier films 12, with the laminate of the color conversion layer 11 and the plurality of barrier films 12 further sandwiched between the plurality of substrate layers 10. Thus, the color conversion film 1D may have a barrier film 12 as shown in FIG. 4 in order to prevent the degradation of the color conversion layer 11 due to oxygen, water, and heat.

(Substrate Layer)

The substrate layer (e.g., substrate layer 10 shown in FIGS. 2 to 4) to be used may be any known metal, film, glass, ceramic, paper, or the like. Specifically, examples of the substrate layer include metal plates and foils such as aluminum (including aluminum alloy), zinc, copper, and iron; plastic films such as cellulose acetate, polyethylene terephthalate (PET), polyethylene, polyester, polyamide, polyimide, polyphenylene sulfide, polystyrene, polypropylene, polycarbonate, polyvinyl acetal, aramid, silicone, polyolefin, thermoplastic fluorine resins, and copolymers of tetrafluoroethylene and ethylene (ETFE); plastic films composed of α-polyolefin resins, polycaprolactone resins, acrylic resins, silicone resins, and copolymer resins thereof with ethylene; paper with the plastic described above laminated thereon; paper coated with the plastic described above; paper with the metal described above laminated or deposited thereon; and plastic films with the metal described above laminated or deposited thereon. When the substrate layer is a metal plate, the surface of the plate may be plated with chromium, nickel, or other metals, or with ceramic.

Among these, especially preferably, glass and resin films are used from the viewpoint of ease of preparation of the color conversion film and ease of formation of the color conversion film. In addition, high-strength films are preferred for handling of a substrate layer in film form without breakage and other risks. Resin films are preferred from the viewpoint of the required characteristics and economy, and especially preferably plastic films selected from the group consisting of PET, polyphenylene sulfide, polycarbonate, and polypropylene from the viewpoint of economy and ease of handling. In the case where the color conversion film is dried or where the color conversion film is formed under pressure with an extruder at a high temperature of 200° C. or higher, polyimide films are preferred from the viewpoint of heat resistance. The surface of the substrate layer may be previously treated for mold release for ease of detachment of the film.

The thickness of the substrate layer is not particularly limited, and the lower limit is preferably 25 μm or more, more preferably 38 μm or more. The upper limit is preferably 5000 μm or less, more preferably 3000 μm or less.

(Color Conversion Layer)

Next, an example of the method of manufacturing the color conversion layer of the color conversion film according to the present invention will be described. The method of manufacturing the color conversion layer comprises applying the color conversion composition prepared in the method described above on a base such as a substrate layer or a barrier film, and drying it. This results in formation of the color conversion layer (e.g., color conversion layer 11 shown in FIGS. 1 to 4). The application can be performed using, for example, a reverse roll coater, a blade coater, a slit die coater, a direct gravure coater, an offset gravure coater, a kiss coater, a natural roll coater, an air knife coater, a roll blade coater, a reverse roll blade coater, a two-stream coater, a rod coater, a wire bar coater, an applicator, a dip coater, a curtain coater, a spin coater, or a knife coater. Application using slit die coater is preferred in order to achieve uniform thickness of the color conversion layer.

The color conversion layer can be dried using a common heater such as a hot-air drier or an infra-red dryer. The color conversion film is dried using a common heater such as a hot-air drier or an infra-red dryer. In this case, heating conditions are usually at 40° C. to 250° C. for 1 minute to 5 hours, preferably at 60° C. to 200° C. for 2 minutes to 4 hours. It is also possible to heat cure in stages, such as step curing.

After preparation of the color conversion layer, the substrate layer can be changed as necessary. In this case, exemplary simple methods include, but not limited to, replacement methods using a hot plate, and methods using a vacuum laminator or a dry film laminator.

The thickness of the color conversion layer is not particularly limited, and preferably from 10 μm to 1000 μm. When the thickness of the color conversion layer is less than 10 μm, the strength of the color conversion film is problematically decreased. When the thickness of the color conversion layer is over 1000 μm, it is difficult to form the color conversion film due to the increased tendency to crack. More preferably, the thickness of the color conversion layer is from 30 μm to 100 μm.

On the other hand, from the viewpoint of improving the heat resistance of the color conversion film, the thickness of the color conversion film is preferably 200 μm or less, more preferably 100 μm or less, still more preferably 50 μm or less.

The thickness of the color conversion film in the present invention refers to a thickness (average thickness), as measured based on Method A, determination of thickness by mechanical scanning in Plastics-Film and sheeting-Determination of thickness, JIS K7130 (1999).

(Barrier Film)

The barrier film (e.g., barrier film 12 shown in FIG. 4) is used as appropriate in the color conversion layer in order to, for example, improve the gas barrier properties. Examples of the barrier film include metallic oxide films and metallic nitride films containing inorganic oxides, such as silicon oxide, aluminum oxide, titanium oxide, tantalum oxide, zinc oxide, tin oxide, indium oxide, yttrium oxide, and magnesium oxide, inorganic nitrides, such as silicon nitride, aluminum nitride, titanium nitride, and silicon carbide nitride, and combinations thereof, and other elements in addition to them; as well as films composed of various resins such as polyvinylidene chloride, acrylic resins, silicone resins, melamine resins, urethane resins, fluorine resins, and polyvinyl alcohol resins such as saponified vinyl acetate. Examples of the barrier film having a barrier function against water include films composed of various resins such as polyethylene, polypropylene, nylon, polyvinylidene chloride, copolymers of vinylidene chloride and vinyl chloride, copolymers of vinylidene chloride and acrylonitrile, fluorine resins, and polyvinyl alcohol resins such as saponified vinyl acetate.

The barrier film may be provided on the both side of the color conversion layer 11 as the barrier films 12 illustrated in FIG. 4, or on only one side of the color conversion layer 11. Depending on the functions required for the color conversion film, an auxiliary layer may further be provided, having an antireflection function, an antiglare function, an anti-reflection and -glare function, a hard coating function (anti-wear function), an anti-static function, an antifouling function, an electro-magnetic shielding function, an infrared cutoff function, an ultraviolet cutoff function, a polarizing function, and/or a toning function.

<Excitation Light>

Any types of excitation light can be used, emitting light in the wavelength region that can be absorbed by the light emitting substance to be mixed, such as the compound represented by the general formula (1). Any types of excitation light are basically available, including fluorescent light sources, such as hot cathode fluorescent lamps, cold cathode fluorescent lamps, and inorganic electroluminescences (EL), organic EL device light sources, LED light sources, incandescent light sources, and sunlight. Excitation light from LED light sources is particularly preferred. For display and illumination applications, excitation light from blue LED light sources that have an excitation light with a wavelength ranging from 430 nm to 500 nm is further preferred in that the color purity of blue light can be improved.

The excitation light may have one emission peak, or two or more emission peaks, but preferably has one emission peak in order to improve the color purity. Arbitrary combination of plurality of emission light sources having different types of emission peaks can be used.

<Light Source Unit>

The light source unit according to embodiments of the present invention comprises at least a light source and the color conversion film described above. The light source included in the light source unit according to the present invention is the source of the excitation light described above. The light source and the color conversion film may be positioned in any arrangement. The light source and the color conversion film may be closely connected, or the light source and the color conversion film may be separated in a remote phosphor configuration. The light source unit may further comprise a color filter in order to improve the color purity.

As described above, since the excitation light with a wavelength ranging from 430 nm to 500 nm has relatively small excitation energy, decomposition of light emitting substances such as the compound represented by the general formula (1) can be prevented. Thus, the light source used in the light source unit preferably is a light emitting diode having a maximum emission at a wavelength ranging from 430 nm to 500 nm. More preferably, the light source has a maximum emission at a wavelength ranging from 440 nm to 470 nm.

Preferably, the light source is a light emitting diode with the emission wavelength peak ranging from 430 nm to 470 nm, the emission wavelength region ranging from 400 nm to 500 nm, and the emission spectrum satisfying the formula (f1):

[Formula 1]

$$1>\beta/\alpha\geq 0.15 \quad \text{(f1)}$$

In the formula (f1), $\alpha$ represents the emission intensity at the emission wavelength peak in the emission spectrum. $\beta$ represents the emission intensity at a wavelength of the emission wavelength peak with addition of 15 nm.

The light source unit in embodiments of the present invention can be used for display, illumination, interior decoration, labeling, sign, and other applications, and especially preferably for display or illumination application.

<Display and Illumination Device>

The display according to embodiments of the present invention comprises at least the color conversion film described above. For example, a display such as a liquid crystal display employs the light source unit comprising e.g., the light source and the color conversion film described above as a backlight unit. The illumination device according to embodiments of the present invention comprises at least the color conversion film described above. For example, the illumination device comprises a combination of a blue LED light source as a light source unit, and a color conversion film for converting a blue light from the blue LED light source into a light having longer wavelength, such that the illumination device emits a white light.

<Light Emitting Device>

In embodiments of the present invention, the light emitting device comprises an anode, a cathode, and an organic layer positioned between the anode and the cathode. The organic layer of the light emitting device emits a light by electric energy. The pyrromethene-boron complex according to the present invention may be used in any layers in the light emitting device, and preferably in the light emitting layer in the light emitting device because of its high fluorescence quantum yield. Particularly preferably, the pyrromethene-boron complex is used as a dopant material in the light emitting layer because of its excellent fluorescence quantum yield.

EXAMPLES

The present invention will be described with reference to Examples, but is not limited to Examples described below. In the following Examples and Comparative Examples, the compounds G-1 to G-36, and G-101 to G-106 are compounds represented below:

[Chem 14]

G-1

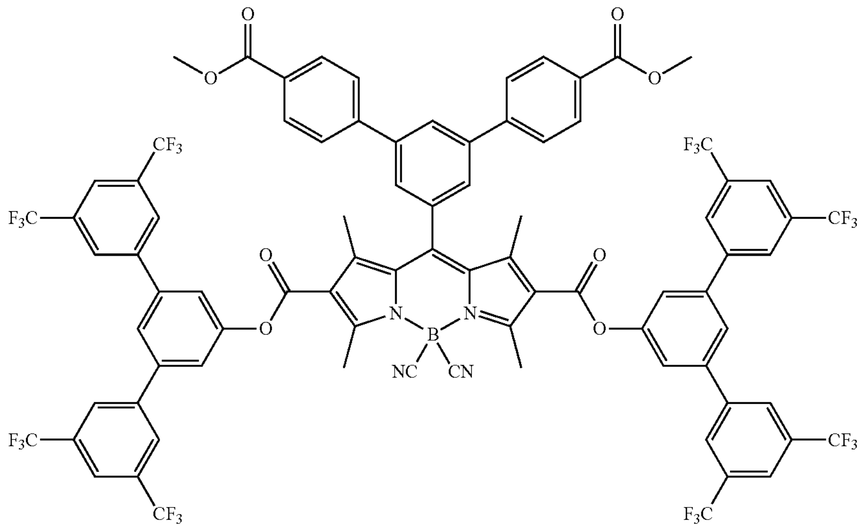

Molecular Weight: 1695.08

-continued
G-2
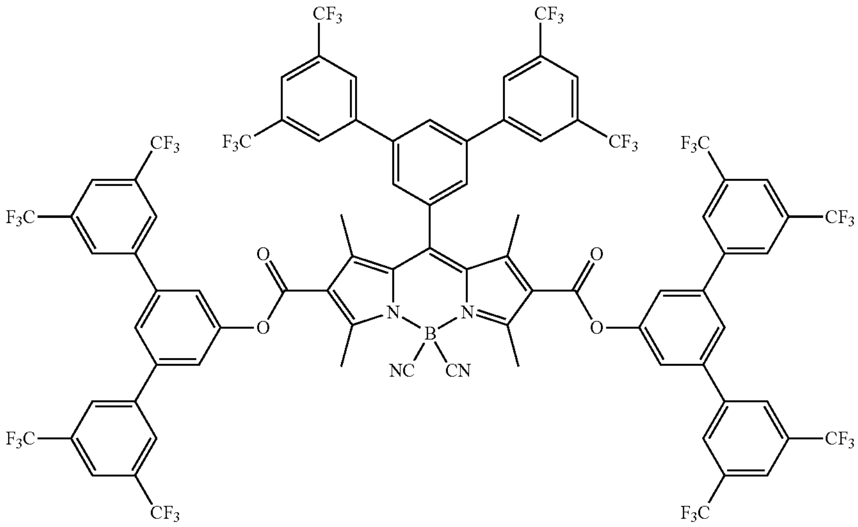
Molecular Weight: 1851.00
G-3
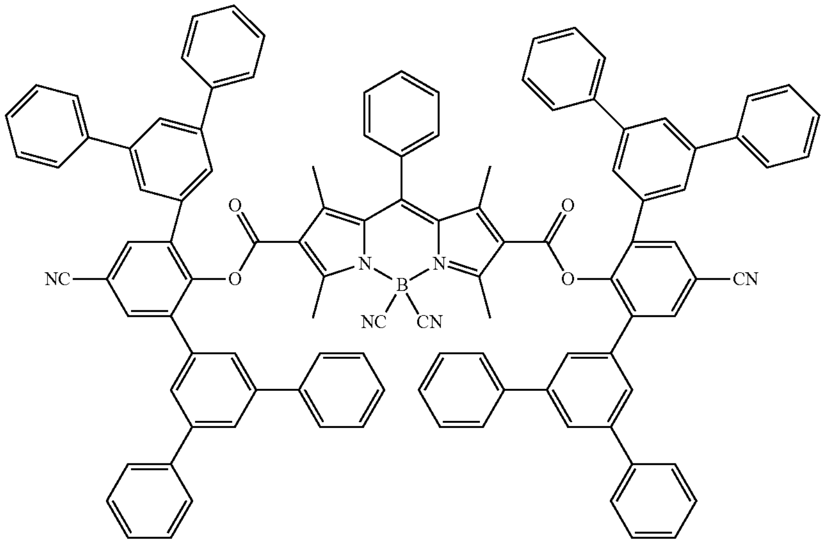
Molecular Weight: 1541.63

-continued
G-4
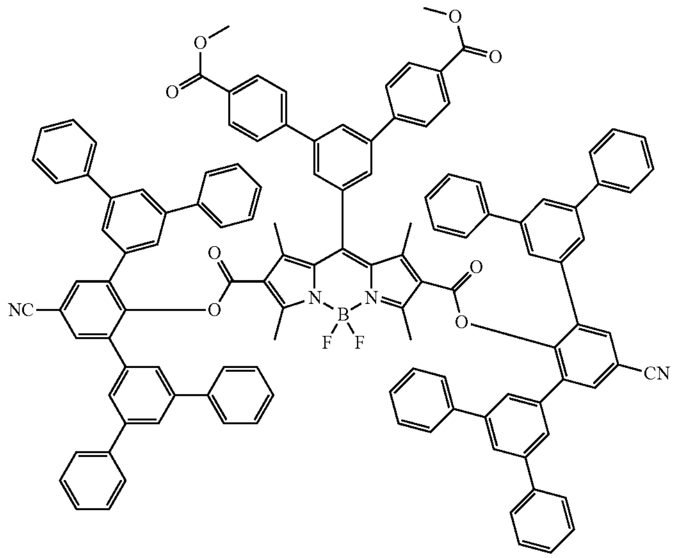
Molecular Weight: 1795.86
G-5
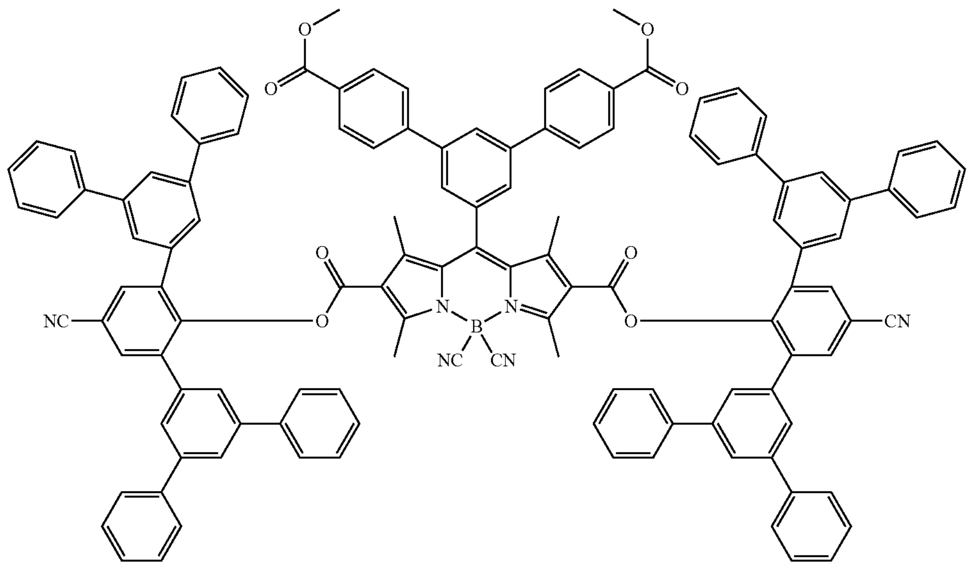
Molecular Weight: 1809.90

-continued
G-6
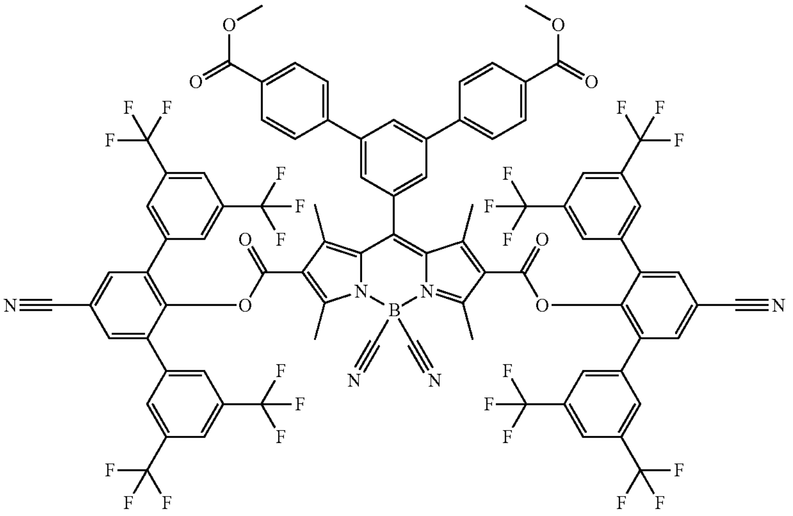
Molecular Weight: 1745.10
[Chem 15]
G-7
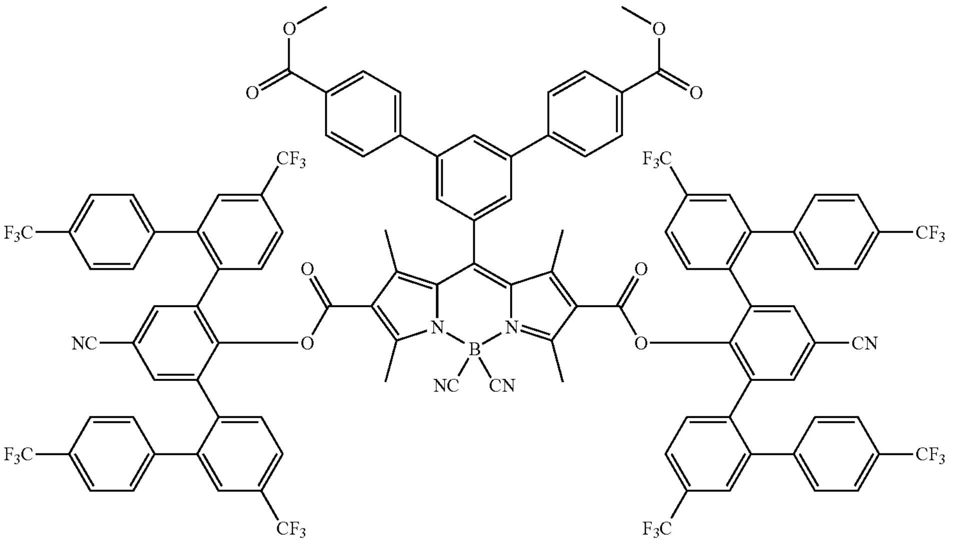
Molecular Weight: 2049.49
G-8
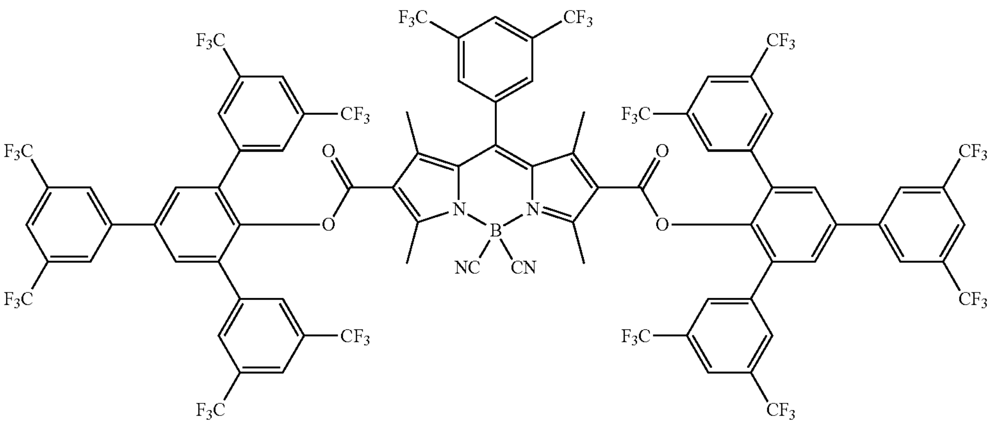
Molecular Weight: 1987.00

-continued
G-9
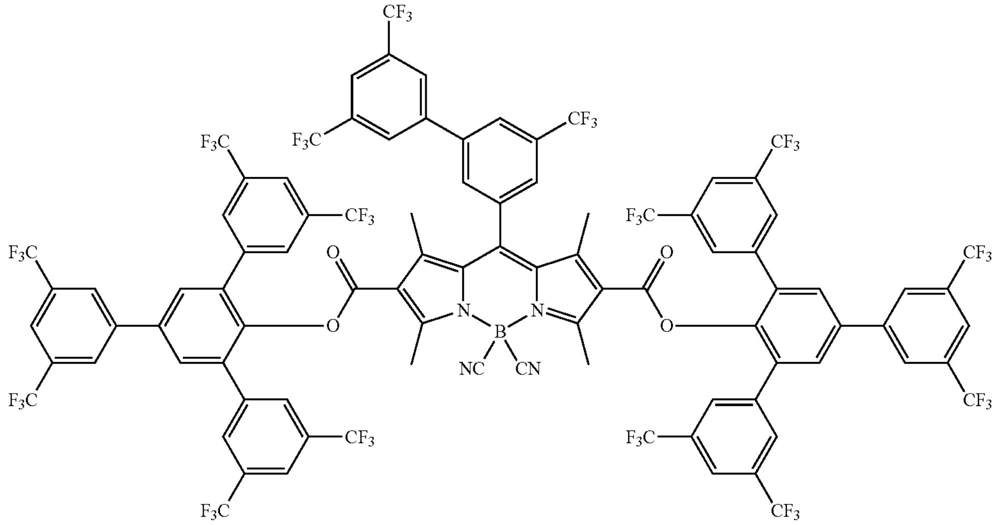
Molecular Weight: 2131.09
G-10
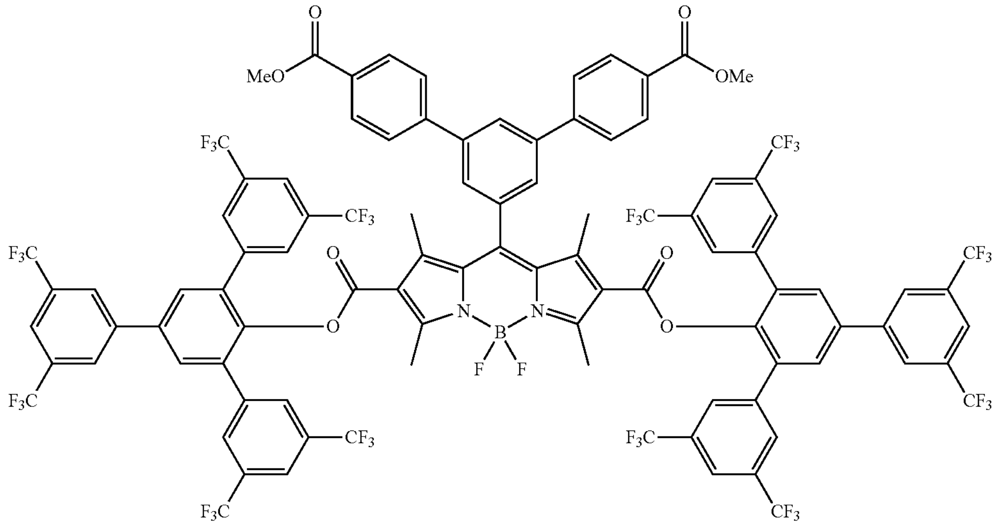
Molecular Weight: 2105.23

-continued
[Chem 16]
G-11
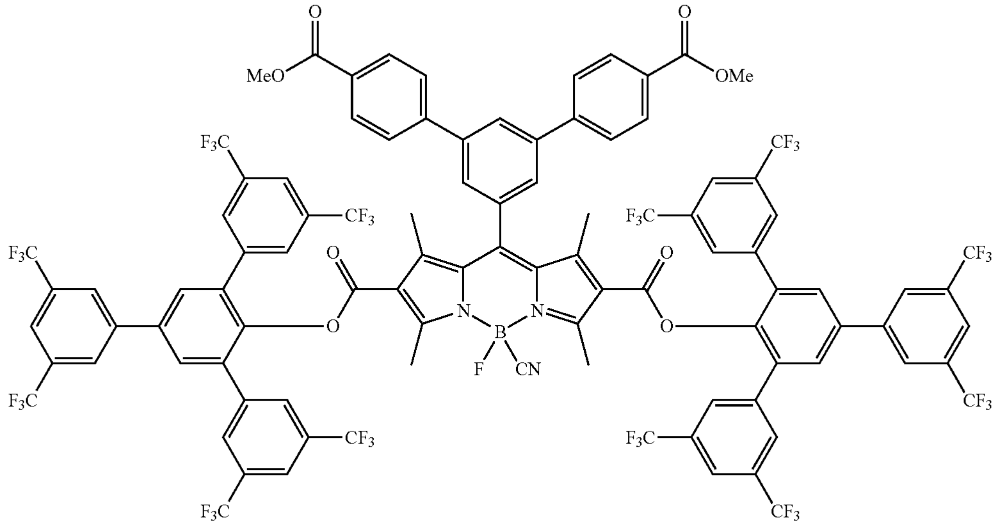
Molecular Weight: 2112.25
G-12
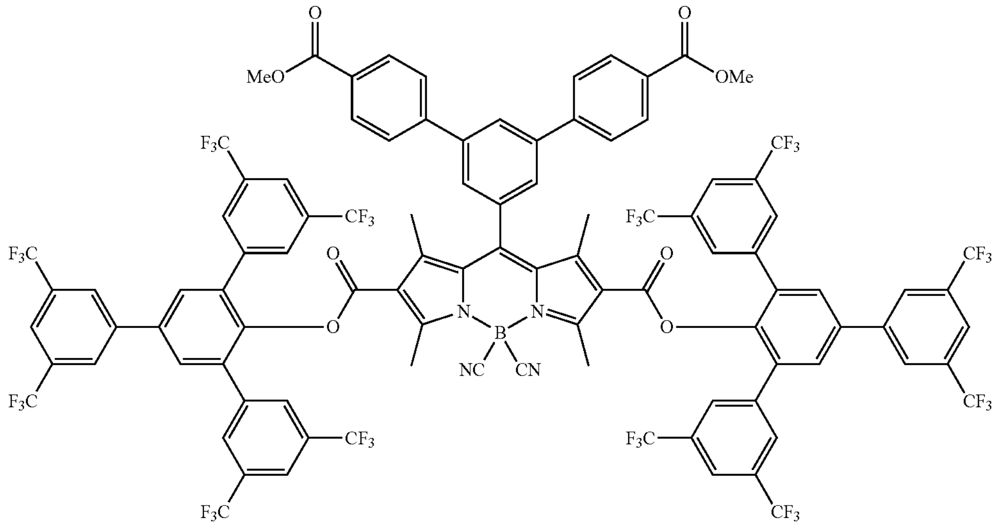
Molecular Weight: 2119.27

-continued
G-13
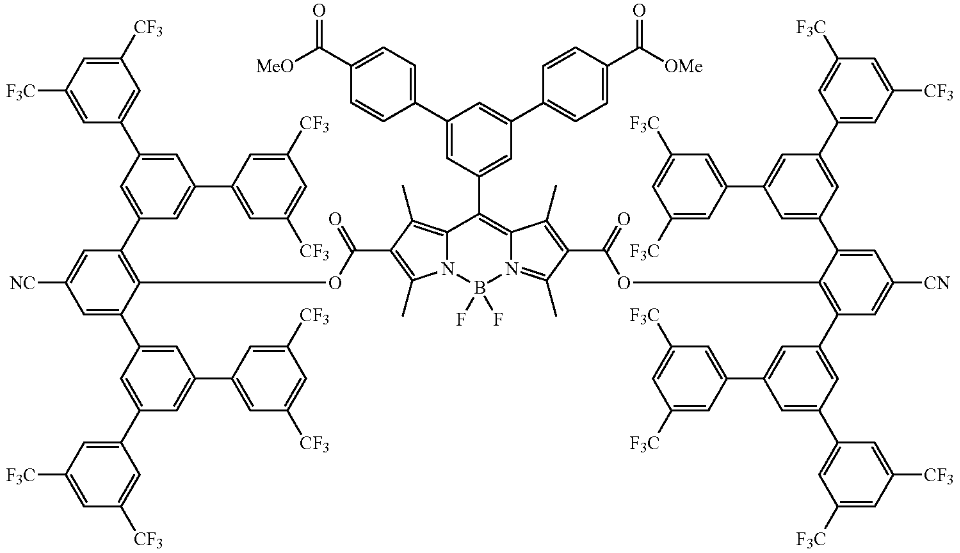
Molecular Weight: 2883.83
[Chem 17]
G-14
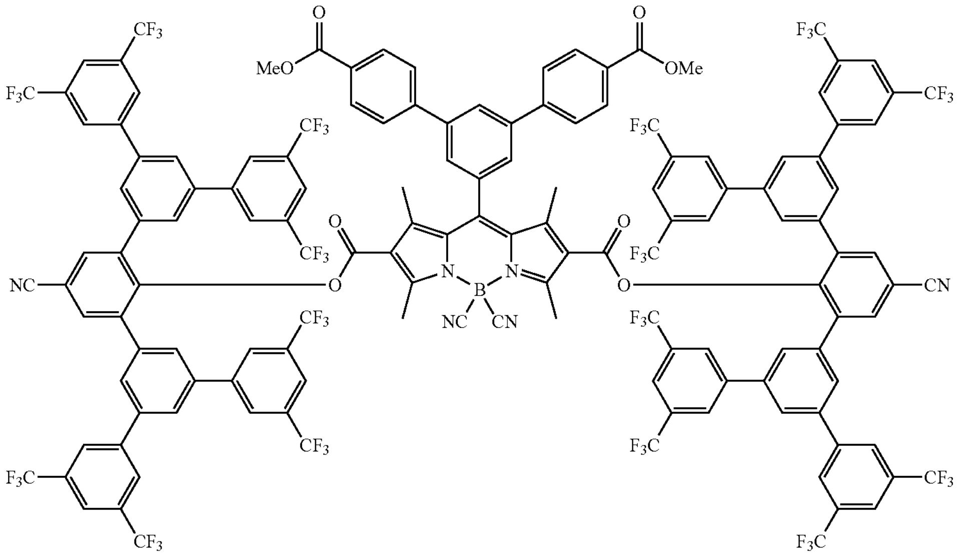
Molecular Weight: 2897.87

-continued
G-15
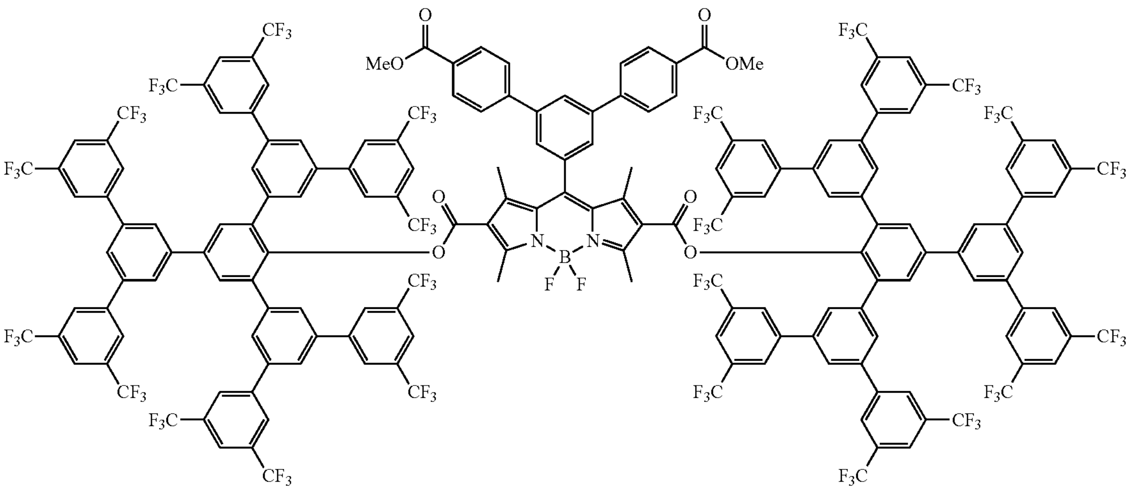
Molecular Weight: 3834.38
G-16
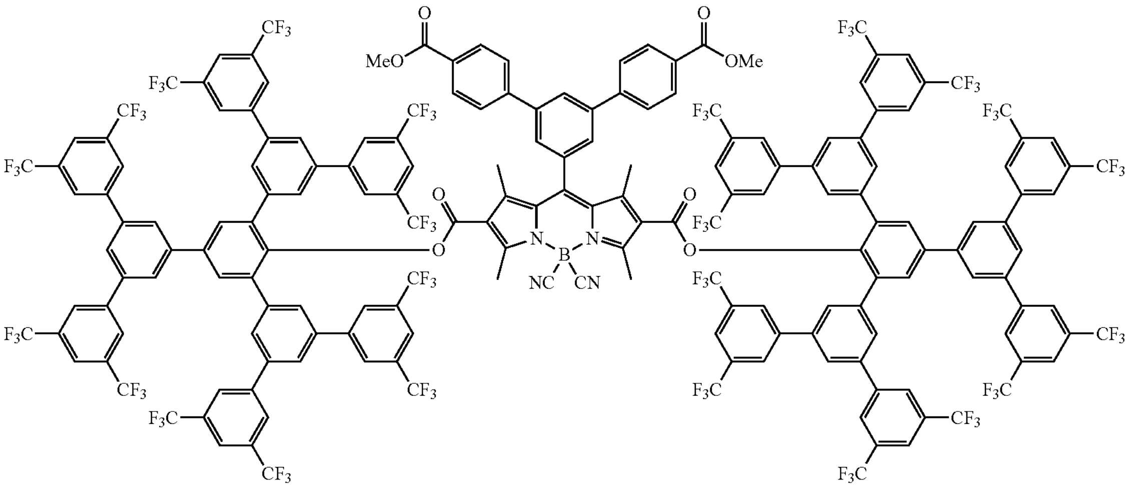
Molecular Weight: 3848.42
[Chem 18]
G-17
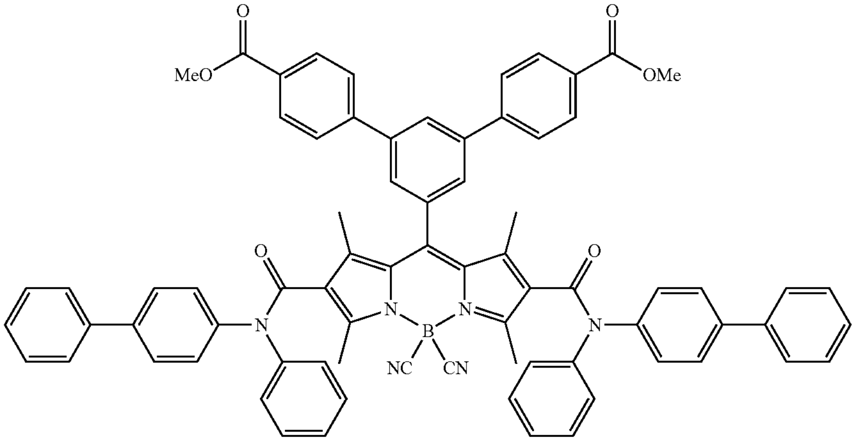
Molecular Weight: 1149.13

-continued
G-18
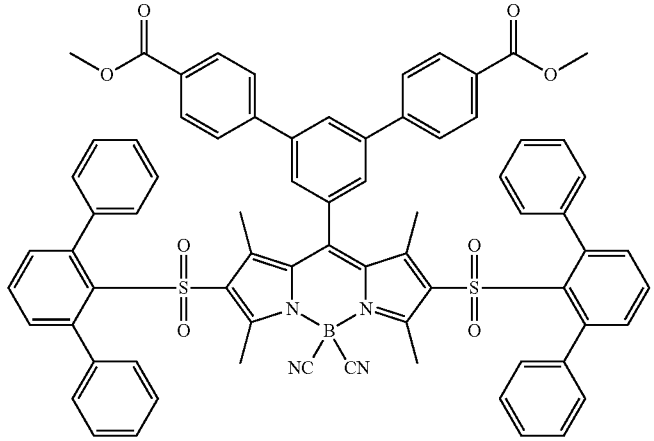
Molecular Weight: 1191.19
G-19
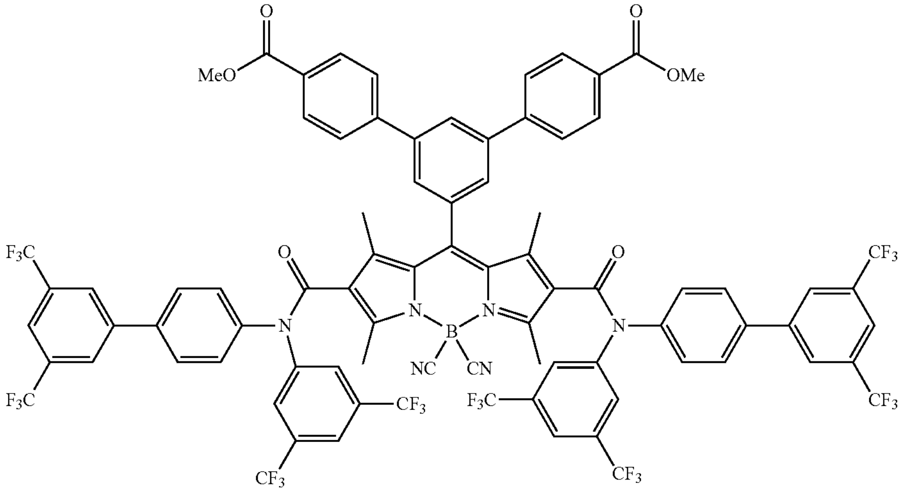
Molecular Weight: 1693.11
G-20
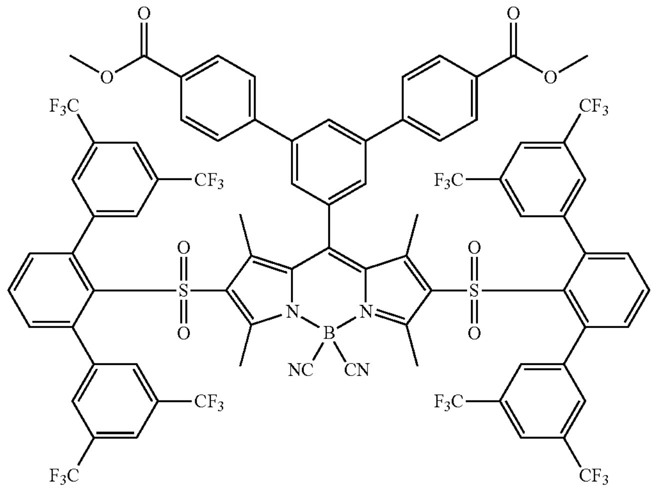
Molecular Weight: 1735.18

-continued
G-21
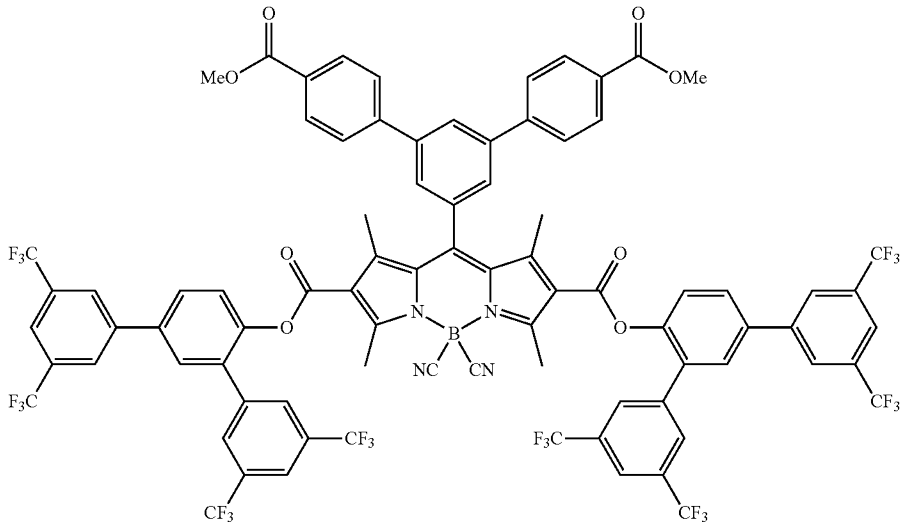
Molecular Weight: 1695.08
G-22
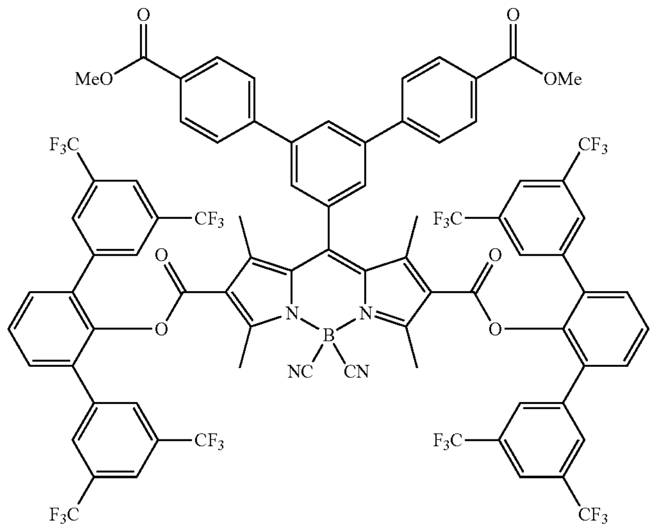
Molecular Weight: 1695.08

-continued
[Chem 19]
G-23
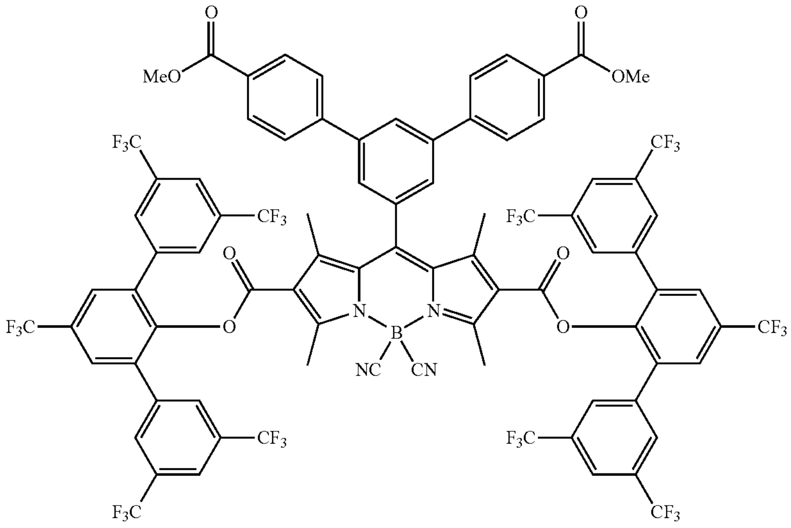
Molecular Weight: 1831.08
G-24
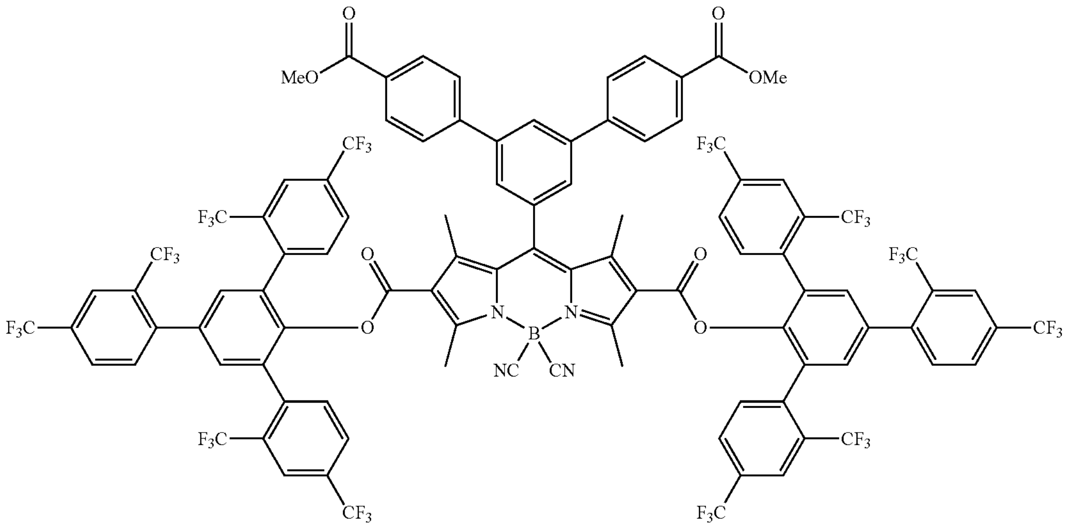
Molecular Weight: 2119.27

-continued
G-25
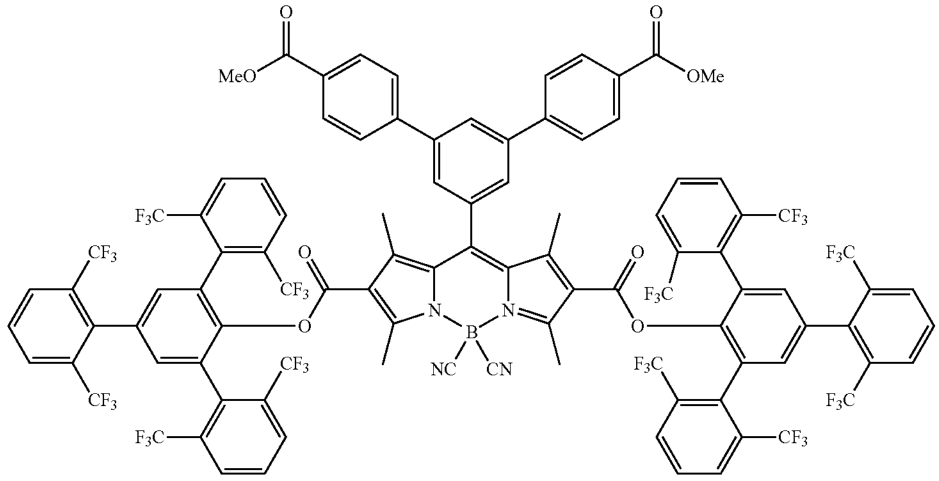
Molecular Weight: 2119.27
G-26
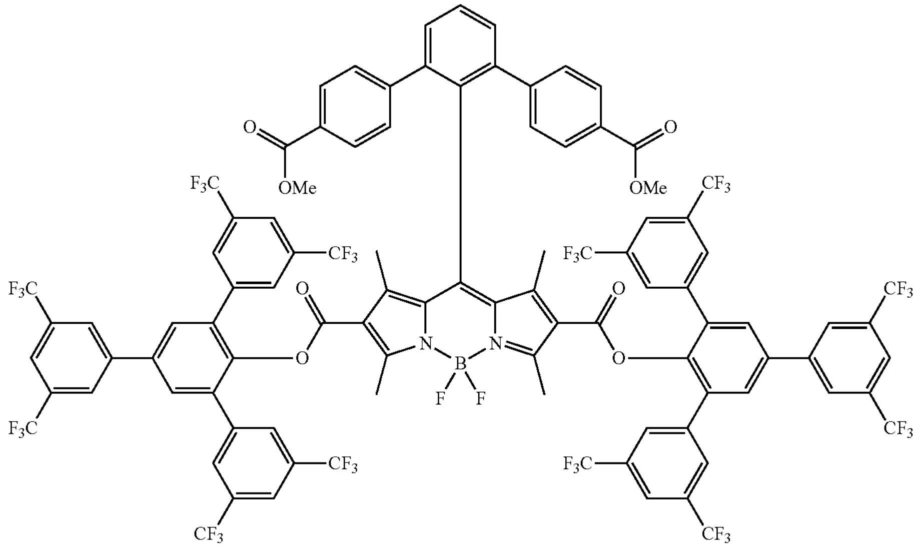
Molecular Weight: 2105.23

-continued
[Chem 20]
G-27
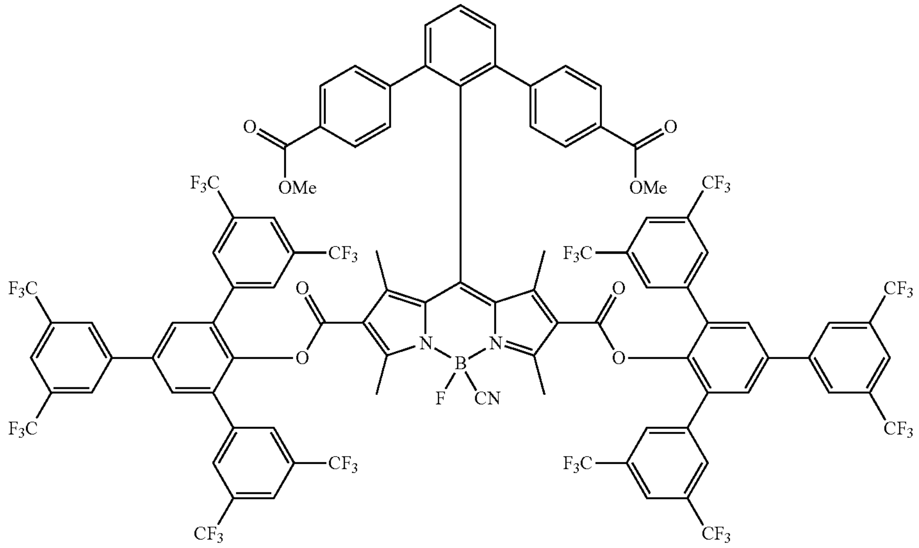
Molecular Weight: 2112.25
G-28
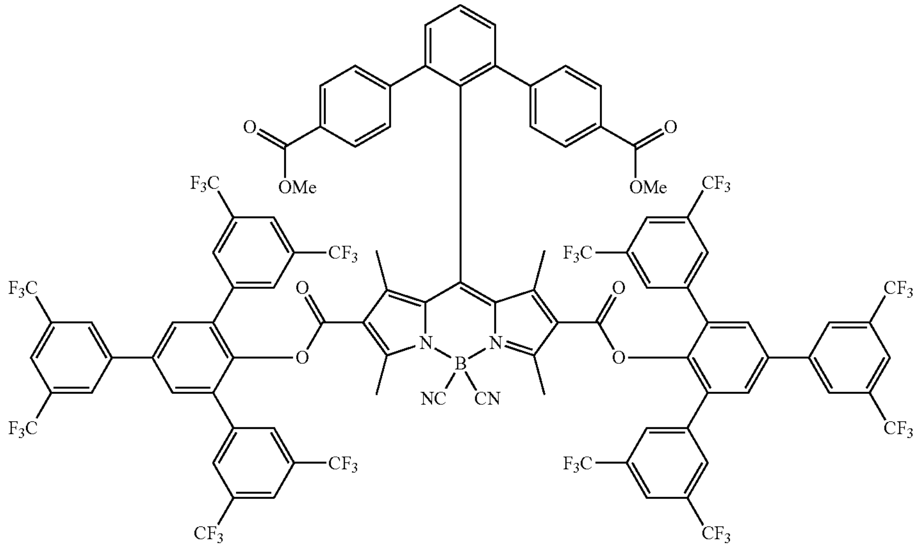
Molecular Weight: 2119.27

-continued
G-29
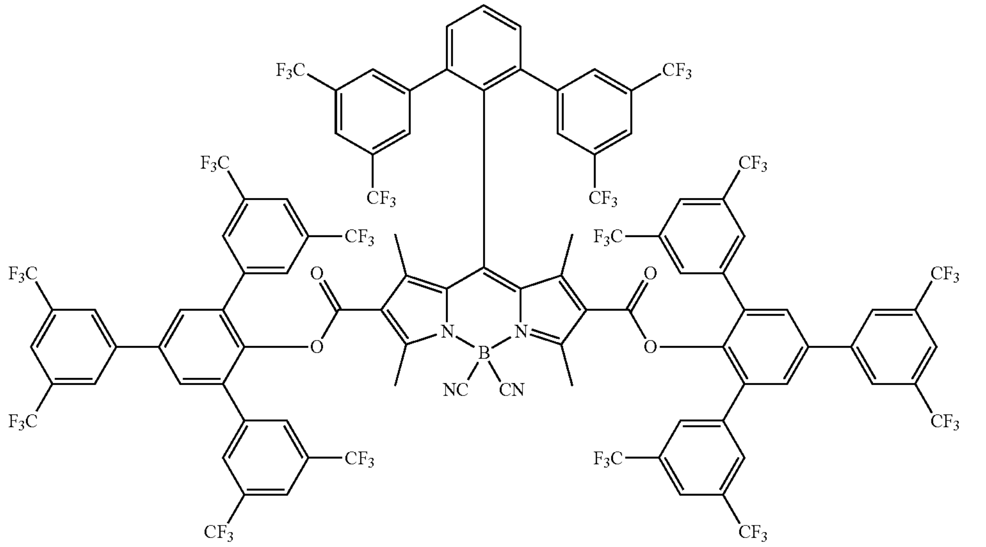
Molecular Weight: 2275.19
G-30
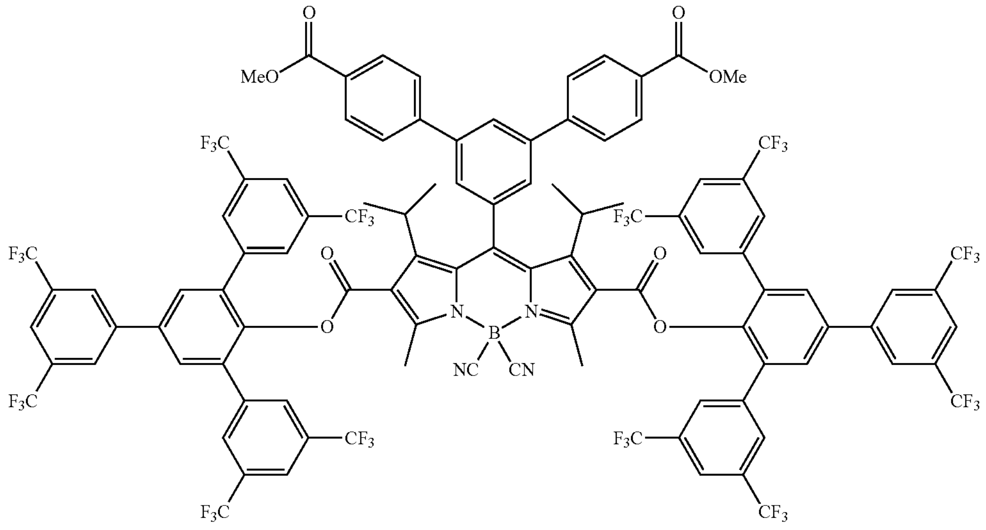
Molecular Weight: 2175.38

-continued
[Chem 21]
G-31
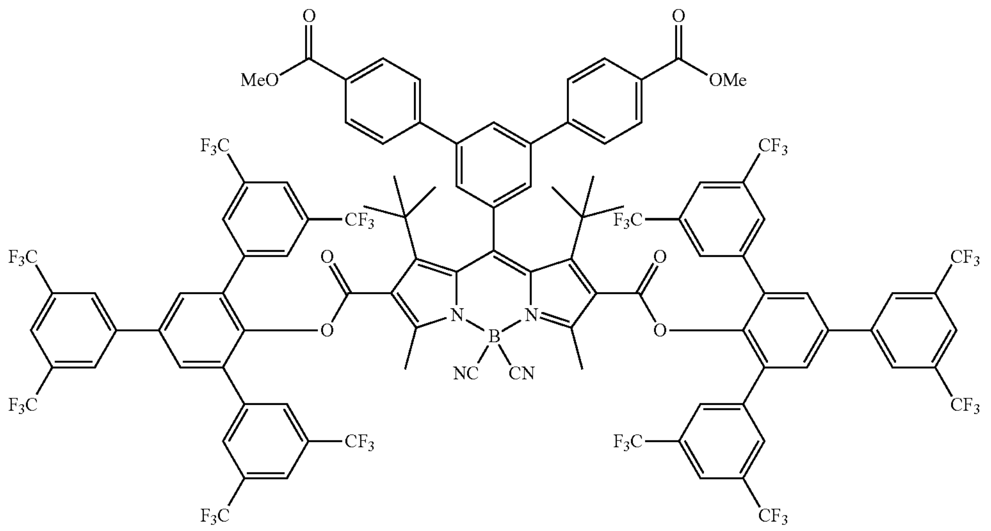
Molecular Weight: 2203.43
G-32
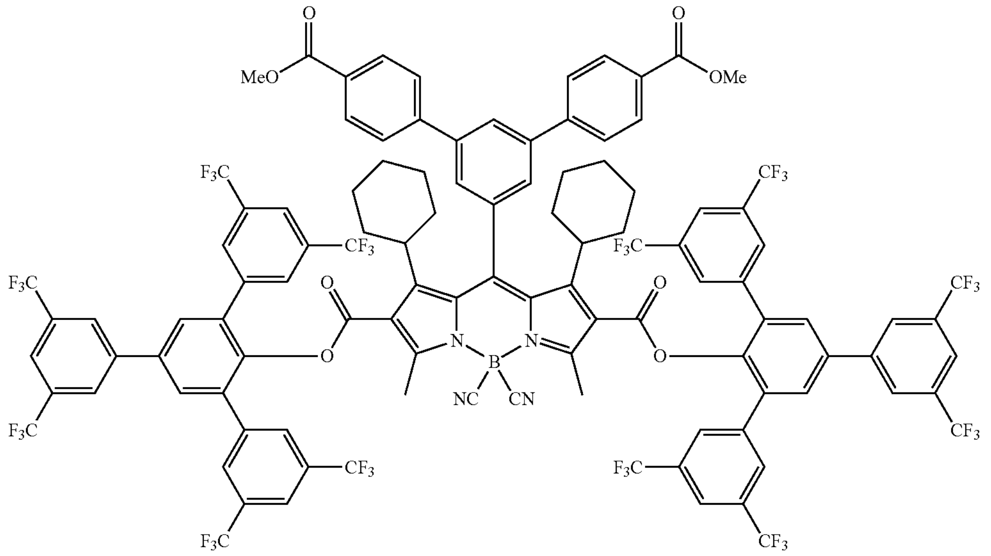
Molecular Weight: 2255.51

-continued
G-33
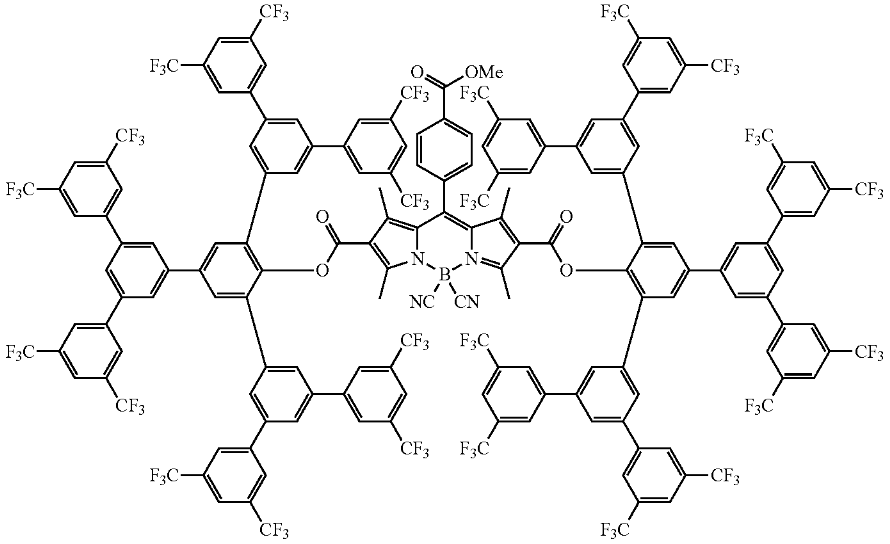
Molecular Weight: 3638.19
[Chem 22]
G-34
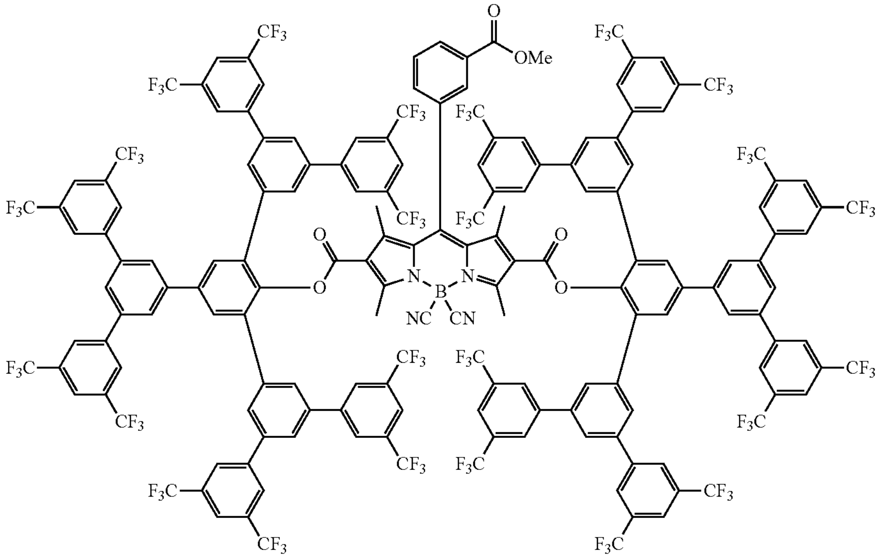
Molecular Weight: 3638.19

-continued
G-35
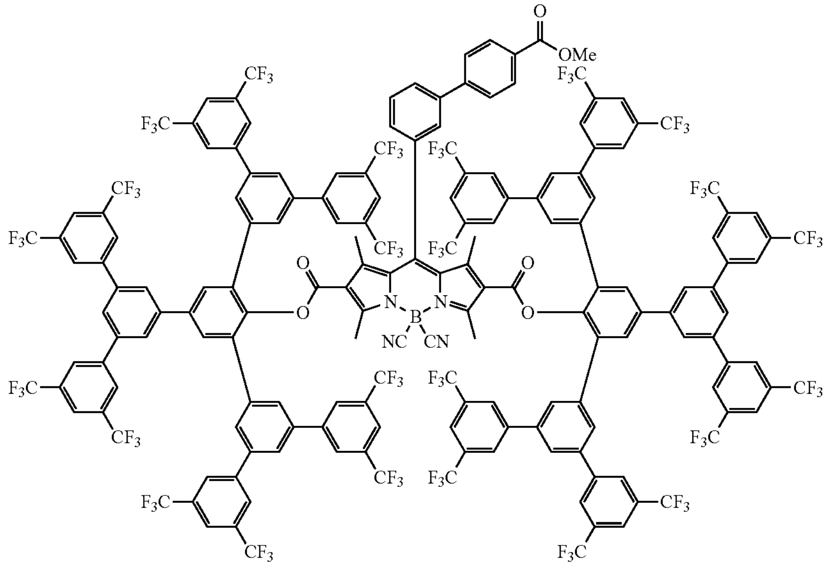
Molecular Weight: 3714.29
G-36
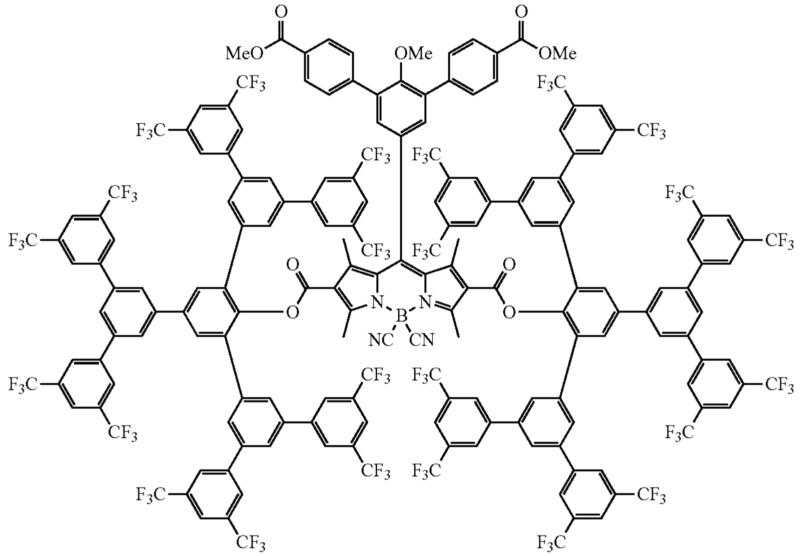
Molecular Weight: 3878.45
[Chem 23]
G-101
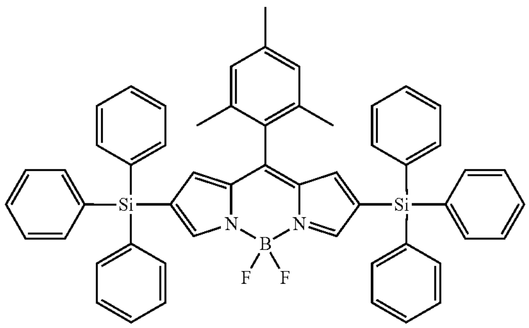
Molecular Weight: 826.94
G-102
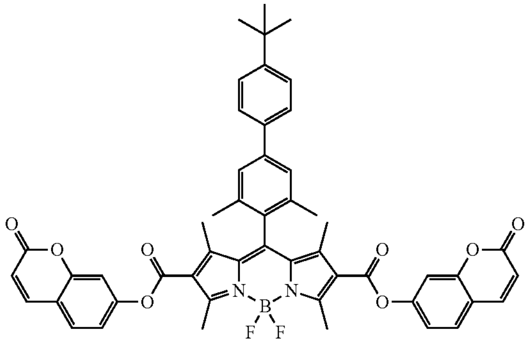
Molecular Weight: 860.72

-continued

G-103

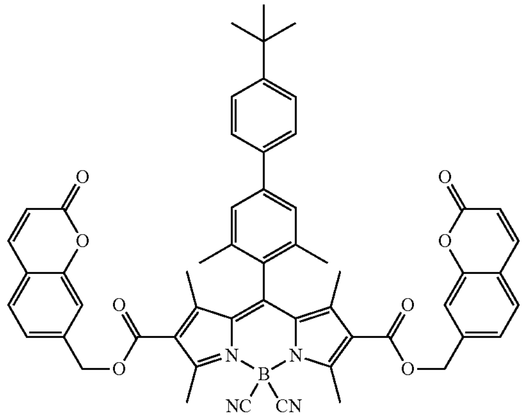

Molecular Weight: 902.81

G-104

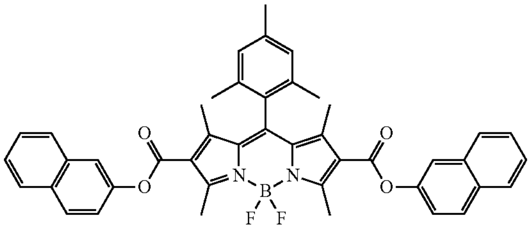

Molecular Weight: 706.60

G-105

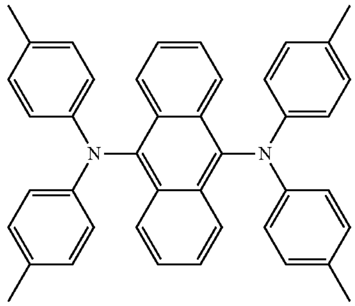

Molecular Weight: 568.76

G-106

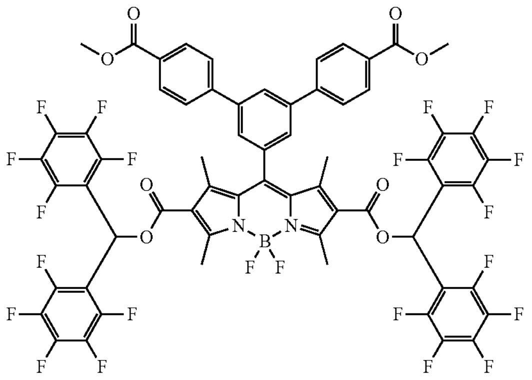

Molecular Weight: 1372.72

The evaluation methods for structural analysis in Examples and Comparative Examples are as described below.

<$^{1}$H-NMR Measurement>

$^{1}$H-NMR of the compounds were measured using superconducting FTNMR EX-270 (JEOL Ltd.), in a deuterated chloroform solution.

<Measurement of Fluorescence Spectrum>

The fluorescence spectra of the compounds when the compounds were dissolved in toluene at a concentration of $1\times10^{-6}$ mol/L and excited at a wavelength of 460 nm were measured using an F-2500 fluorescence spectrophotometer (Hitachi, Ltd.)

<Measurement of Fluorescence Quantum Yield>

The fluorescence quantum yields of the compounds when the compounds were dissolved in toluene at a concentration of $1\times10^{-6}$ mol/L and excited at a wavelength of 460 nm were measured using an absolute PL quantum yield measurement system (Quantaurus-QY, Hamamatsu Photonics K.K.).

Synthesis Example 1

A method of synthesizing a compound G-23 of Synthesis Example 1 in the present invention will be described. In the method of synthesizing the compound G-23, 3.0 g of 3,5-dibromobenzaldehyde, 5.3 g of 4-methoxycarbonylphenylboronic acid, 0.4 g of tetrakis(triphenylphosphine)palladium (0), and 2.0 g of potassium carbonate were added into a flask, and then nitrogen substitution was performed. To this, 30 mL of degassed toluene and 10 mL of degassed water were added, and then the mixture was refluxed for 4 hours. After cooling the reaction solution to room temperature, the organic layer was separated and then washed with saturated brine. The organic layer was dried over magnesium sulfate, filtered, and evaporated off the solvent. The obtained reaction product was purified by chromatography on silica gel to obtain 3.5 g of 3,5-bis(4-methoxycarbonylphenyl)benzaldehyde as a white solid.

Next, 1.5 g of 3,5-bis(4-methoxycarbonylphenyl)benzaldehyde and 7.16 g of 2,4-dimethyl 2,4,6-tris(3,5-bistrifluoromethylphenyl)phenyl pyrrole were added to the reaction solution described above, followed by 200 mL of anhydrous dichloromethane and trifluoroacetic acid (one drop) with stirring under a nitrogen atmosphere for 4 hours. To this, a solution of 0.85 g of 2,3-dichloro-5,6-dicyano-1,4-benzoquinone in anhydrous dichloromethane was added with stirring for additional 1 hour. After completion of the reaction, 7.0 mL of boron trifluoride diethyl ether complex and 7.0 mL of diisopropylethylamine were added with stirring for 4 hours, followed by 100 mL of water with stirring, and then the organic layer was separated. The organic layer was dried over magnesium sulfate, filtered, and evaporated off the solvent. The obtained reaction product was purified by chromatography on silica gel to obtain 0.4 g of fluorinated boron complex.

Next, 0.4 g of the obtained fluorinated boron complex is placed into a flask, followed by addition of 5 mL of dichloromethane, 0.67 mL of trimethylsilyl cyanide, and 0.20 mL of boron trifluoride diethyl ether complex with stirring for 18 hours. After addition of 5 mL of water, the organic layer was separated. The organic layer was dried over magnesium sulfate, filtered, and evaporated off the solvent. The obtained reaction product was purified by chromatography on silica gel to obtain 0.28 g of a compound. The results of the $^1$H-NMR analysis of the obtained compound were as described below, from which the compound was identified as a compound G-23.

$^1$H-NMR ($CDCl_3$, ppm): 7.95-7.78 (m, 11H), 7.63-7.48 (m, 22H), 4.72 (s, 6H), 2.58 (s, 6H), 1.50 (s, 6H)

In the Examples and Comparative Examples described below, a backlight unit comprising the color conversion film, a blue LED chip (emission peak wavelength: 445 nm), and a light guiding panel was used, in which the color conversion film was laminated on one surface of the light guiding panel, and a prism sheet was laminated on the color conversion film. After applying a current to turn on the blue LED chip, the initial emission properties of the backlight were measured using a spectral radiance meter (CS-1000, Konica Minolta, Inc.). In measurement of the initial emission properties, the initial values were set such that the brightness of the light from the blue LED chip was 800 cd/$m^2$ without color conversion film inserted. The light durability was then evaluated by continuously irradiating light from the blue LED chip at room temperature and measuring the time until the brightness decreased by 5%.

Example 1

Example 1 of the present invention was a case where the pyrromethene-boron complex according to embodiments described above was used as a light emitting material (color conversion material). In Example 1 using an acrylic resin was used as binder resin, 100 parts by weight of the acrylic resin was mixed with 0.25 parts by weight of the compound G-1 as a light emitting material and 400 parts by weight of toluene as a solvent. Then, the mixture was stirred and deaerated using a planetary stirring and deaerating apparatus “Mazerustar KK-400” (Kurabo Industries Ltd.) at 300 rpm for 20 minutes, to obtain a color conversion composition.

Similarly, using a polyester resin as a binder resin, 100 parts by weight of the polyester resin was mixed with 300 parts by weight of toluene as a solvent. Then, the solution was stirred and deaerated using a planetary stirring and deaerating apparatus “Mazerustar KK-400” (Kurabo Industries Ltd.) at 300 rpm for 20 minutes, to obtain an adhesive composition.

Next, the color conversion composition obtained as described above was applied on “Lumirror” U48 (Toray Industries, Inc., thickness: 50 μm) as a first substrate layer using a slit die coater, heated and dried at 100° C. for 20 minutes to form a layer (A) having an average thickness of 16 μm.

Similarly, the adhesive composition obtained as described above was applied on the PET substrate layer side of a light diffusion film “Chemicalmat” 125PW (Kimoto Co., Ltd., thickness: 138 μm) as a second substrate layer using a slit die coater, heated and dried at 100° C. for 20 minutes to form a layer (B) having an average thickness of 48 μm.

Next, these two layers (A) and (B) were heat laminated such that the color conversion layer in the layer (A) was laminated directly on the adhesive layer in the layer (B) to prepare a color conversion film having a lamination structure of “first substrate layer/color conversion layer/adhesive layer/second substrate layer/light diffusion layer.”

The color conversion film was used for color conversion of a light (blue light) from the blue LED chip. When only the green light emission region was extracted, a green light emission was obtained with high color purity, a peak wavelength of 529 nm, and a full width at half peak maximum in the emission spectrum of 27 nm. The emission intensity at the peak wavelength is a relative value when the quantum yield of Comparative Example 1 as described later is 1.00. The quantum yield of Example 1 was 1.34. The time until the brightness of a light from the blue LED chip continuously irradiated at room temperature decreased by 5% was 1010 hours. The light emitting materials and the evaluation results in Example 1 are shown in Table 1-1 described below.

Examples 2 to 36 and Comparative Examples 1 to 6

In Examples 2 to 36 of the present invention and Comparative Examples 1 to 6 to the present invention, color conversion films were prepared and evaluated as in Example 1 except that the compounds described in Tables 1-1 to 1-3 described below (compounds G-2 to G-36, and G-101 to G-106) were used as light emitting materials as appropriate. The light emitting materials and the evaluation results in Examples 2 to 36 and Comparative Examples 1 to 6 are shown in Tables 1-1 to 1-3. The quantum yields (relative values) in the tables are quantum yields at the peak wavelength and are relative values when the intensity of Comparative Example 1 is 1.00 as in Example 1. The durability against light is preferably longer time, specifically preferably 800 hours or longer.

TABLE 1-1

| | Light emitting material | Peak wave-length (nm) | Full width at half peak maximum (nm) | Quantum yield (relative value) | Durability against light (h) |
|---|---|---|---|---|---|
| Example 1 | G-1 | 529 | 27 | 1.34 | 1010 |
| Example 2 | G-2 | 528 | 28 | 1.30 | 1070 |
| Example 3 | G-3 | 527 | 27 | 1.35 | 1180 |
| Example 4 | G-4 | 527 | 26 | 1.28 | 1190 |
| Example 5 | G-5 | 529 | 28 | 1.29 | 1290 |
| Example 6 | G-6 | 528 | 28 | 1.31 | 1460 |
| Example 7 | G-7 | 527 | 27 | 1.30 | 1420 |
| Example 8 | G-8 | 527 | 28 | 1.35 | 1410 |
| Example 9 | G-9 | 529 | 28 | 1.32 | 1440 |
| Example 10 | G-10 | 526 | 27 | 1.33 | 1250 |
| Example 11 | G-11 | 528 | 27 | 1.35 | 1380 |
| Example 12 | G-12 | 527 | 28 | 1.37 | 1790 |
| Example 13 | G-13 | 528 | 28 | 1.28 | 1620 |
| Example 14 | G-14 | 528 | 28 | 1.35 | 1950 |
| Example 15 | G-15 | 528 | 27 | 1.31 | 1810 |
| Example 16 | G-16 | 527 | 26 | 1.32 | 2400 |
| Example 17 | G-17 | 530 | 27 | 1.29 | 1000 |
| Example 18 | G-18 | 526 | 28 | 1.31 | 1010 |

TABLE 1-2

| | Light emitting material | Peak wave-length (nm) | Full width at half peak maximum (nm) | Quantum yield (relative value) | Durability against light (h) |
|---|---|---|---|---|---|
| Example 19 | G-19 | 529 | 28 | 1.33 | 1100 |
| Example 20 | G-20 | 525 | 28 | 1.29 | 1120 |
| Example 21 | G-21 | 527 | 27 | 1.31 | 1390 |

TABLE 1-2-continued

| | Light emitting material | Peak wave-length (nm) | Full width at half peak maximum (nm) | Quantum yield (relative value) | Durability against light (h) |
|---|---|---|---|---|---|
| Example 22 | G-22 | 527 | 28 | 1.36 | 1670 |
| Example 23 | G-23 | 527 | 28 | 1.36 | 1720 |
| Example 24 | G-24 | 527 | 27 | 1.39 | 1840 |
| Example 25 | G-25 | 527 | 28 | 1.38 | 1880 |
| Example 26 | G-26 | 541 | 29 | 1.30 | 1380 |
| Example 27 | G-27 | 540 | 28 | 1.29 | 1680 |
| Example 28 | G-28 | 541 | 29 | 1.31 | 1870 |
| Example 29 | G-29 | 545 | 28 | 1.32 | 1910 |
| Example 30 | G-30 | 528 | 28 | 1.33 | 2090 |
| Example 31 | G-31 | 528 | 28 | 1.37 | 2100 |
| Example 32 | G-32 | 527 | 28 | 1.36 | 2150 |
| Example 33 | G-33 | 527 | 27 | 1.30 | 2300 |
| Example 34 | G-34 | 527 | 27 | 1.31 | 2300 |
| Example 35 | G-35 | 527 | 27 | 1.32 | 2450 |
| Example 36 | G-36 | 525 | 27 | 1.33 | 2500 |

TABLE 1-3

| | Light emitting material | Peak wave-length (nm) | Full width at half peak maximum (nm) | Quantum yield (relative value) | Durability against light (h) |
|---|---|---|---|---|---|
| Comparative Example 1 | G-101 | 541 | 40 | 1.00 | 100 |
| Comparative Example 2 | G-102 | 530 | 30 | 0.88 | 120 |
| Comparative Example 3 | G-103 | 527 | 31 | 0.79 | 80 |
| Comparative Example 4 | G-104 | 528 | 26 | 0.77 | 70 |
| Comparative Example 5 | G-105 | 540 | 58 | 1.13 | 20 |
| Comparative Example 6 | G-106 | 527 | 28 | 1.29 | 740 |

INDUSTRIAL APPLICABILITY

As described above, the pyrromethene-boron complex, the color conversion composition, the color conversion film, the light source unit, the display, and the illumination device according to the present invention are suitable for achieving both improved color reproduction and high durability.

REFERENCE SIGNS LIST

1A, 1B, 1C, 1D color conversion film

10 substrate layer

11 color conversion layer

12 barrier film

The invention claimed is:

1. A pyrromethene-boron complex compound with a molecular weight of 1000 or more, represented by the following general formula (1):

[Chem 1]

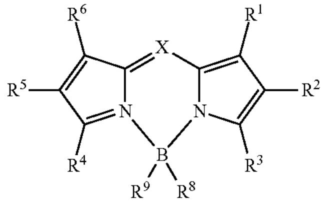

(1)

wherein at least two of $R^1$ to $R^6$ in the general formula (1) are groups represented by the following general formula (2):

[Chem 2]

$$\bullet\!-L^1-L^2\!\left(\!\left(R^{101}\right)_n\right)_m \qquad (2)$$

wherein, in the general formula (1),

X is C—$R^7$ or N;

$R^1$ to $R^9$, other than the groups represented by the following general formula (2) of $R^1$ to $R^6$, each are the same or different, and selected from the group consisting of hydrogen, alkyl, cycloalkyl, heterocyclyl, alkenyl, cycloalkenyl, alkynyl, hydroxy, thiol, alkoxy, alkylthio, aryl ether, aryl thioether, aryl, heteroaryl, halogen, cyano, aldehyde, carbonyl, carboxyl, acyl, ester, amide, carbamoyl, amino, nitro, silyl, siloxanyl, boryl, sulfoxide, sulfonyl, phosphine oxide, and a fused ring formed by adjacent substituents;

wherein, in the general formula (2), $L^2$, each independently, is selected from the group consisting of alkylene, cycloalkylene, arylene, heterocyclyl, and heteroarylene;

when $L^2$ is alkylene, the carbon atom bound to $L^1$, in the alkylene group, is secondary or tertiary carbon;

$R^{101}$, each independently, is selected from the group consisting of cyano, aryl, and cycloalkyl;

n is each independently an integer of 0 to 5, and m is each independently an integer of 1 to 5;

each ($L^2$-$(R^{101})_n$) comprises three or more ring structures; and $L^1$, each independently, is selected from the group consisting of carbonyl, —C(=O)O—, —C(=O)N<, —$S(=O)_2$—, and —P(=O)<.

2. The pyrromethene-boron complex according to claim 1, wherein in the general formula (1), at least one of $R^1$, $R^3$, $R^4$, and $R^6$ is alkyl or cycloalkyl.

3. The pyrromethene-boron complex according to claim 1, wherein in at least one group represented by the general formula (2), n is from 1 to 5, and at least one $R^{101}$ has a group comprising a fluorine atom.

4. The pyrromethene-boron complex according to claim 1, wherein in the general formula (1), X is C—$R^7$, and $R^7$ is aryl or heteroaryl.

5. The pyrromethene-boron complex according to claim 1, wherein the compound represented by the general formula (1) is a compound represented by the following general formula (3):

[Chem 3]

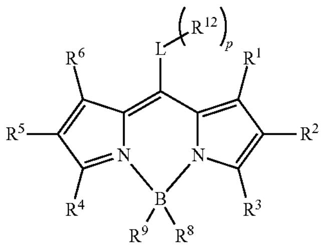

(3)

wherein in the general formula (3), $R^1$ to $R^6$, $R^8$, and $R^9$ are as defined in claim 1;

$R^{12}$, each independently, is aryl or heteroaryl;

L is arylene or heteroarylene; and p is an integer of 1 to 5.

6. The pyrromethene-boron complex according to claim 1, wherein in the general formula (1), at least one of $R^8$ and $R^9$ is cyano.

7. The pyrromethene-boron complex according to claim 1, wherein the compound represented by the general formula (1) exhibits emission with a peak wavelength observed in a region of 500 nm or more and less than 580 nm by use of an excitation light.

8. A color conversion composition for converting an incident light into a light having a longer wavelength than the incident light, comprising:

the pyrromethene-boron complex according to claim 1; and a binder resin.

9. A color conversion film, comprising a layer composed of the color conversion composition according to claim 8 or a cured product thereof.

10. A light source unit, comprising:

a light source; and the color conversion film according to claim 9.

11. A display, comprising the color conversion film according to claim 9.

12. An illumination device, comprising the color conversion film according to claim 9.

* * * * *